US00RE45300E

(19) United States
(12) Reissued Patent
Suzuki

(10) Patent Number: US RE45,300 E
(45) Date of Reissued Patent: Dec. 23, 2014

(54) CONTEXT-ADAPTIVE VARIABLE LENGTH CODER WITH SIMULTANEOUS STORAGE OF INCOMING DATA AND GENERATION OF SYNTAX ELEMENTS

(71) Applicant: Canon Kabushiki Kaisha, Tokyo (JP)

(72) Inventor: Koichi Suzuki, Fuchu (JP)

(73) Assignee: Canon Kabushiki Kaisha, Tokyo (JP)

(21) Appl. No.: 13/785,701

(22) Filed: Mar. 5, 2013

Related U.S. Patent Documents

Reissue of:
(64) Patent No.: 7,903,741
Issued: Mar. 8, 2011
Appl. No.: 11/274,570
Filed: Nov. 15, 2005

(30) Foreign Application Priority Data

Nov. 15, 2004 (JP) ..... 2004-331107

(51) Int. Cl.

| | |
|---|---|
| ***H04N 7/26*** | (2006.01) |
| ***H03M 7/20*** | (2006.01) |
| ***H04N 19/42*** | (2014.01) |
| ***H04N 19/91*** | (2014.01) |
| ***H04N 19/13*** | (2014.01) |
| ***H04N 19/176*** | (2014.01) |
| ***H04N 19/436*** | (2014.01) |
| ***H03M 7/42*** | (2006.01) |
| *H04N 19/93* | (2014.01) |

(52) U.S. Cl.
CPC .... *H04N 19/00478* (2013.01); *H04N 19/00957* (2013.01); *H04N 19/00951* (2013.01); *H04N 19/00121* (2013.01); *H04N 19/00278* (2013.01); *H04N 19/00521* (2013.01); *H03M 7/42* (2013.01)
USPC ..... 375/240.23; 341/67; 382/246

(58) Field of Classification Search
None
See application file for complete search history.

(56) References Cited

U.S. PATENT DOCUMENTS 5,289,577 A * 2/1994 Gonzales et al. ..... 345/506
7,218,677 B2 * 5/2007 Otsuka ..... 375/253

(Continued)

FOREIGN PATENT DOCUMENTS

JP 07-007436 A 1/1995
JP 2004-007555 A 1/2004

(Continued)

OTHER PUBLICATIONS

Huang et al. (May 2004) "Hardware architecture design for H.264/AVC intra frame coder." Proc. 2004 IEEE Int'l Symp. on Circuits and Systems, vol. 2 pp. 269-272.*

(Continued)

*Primary Examiner* — Barry Drennan
(74) *Attorney, Agent, or Firm* — Cowan, Liebowitz & Latman, P.C.

(57) ABSTRACT

A variable-length coding apparatus which receives image data block by block, and generates coded data from syntax elements. A storage unit temporarily stores the image data, while, at the same time, a first syntax element calculating unit calculates a first syntax element from the image data. A first coding unit generates coded data of the first syntax element from a value of the first syntax element. A second syntax element is calculated from the image data by a second syntax element calculating unit that reads out the image data stored in the storage unit. A second coding unit generates coded data of the second syntax element on the basis of the values of the first and second syntax elements, and a packing unit connects the coded data of the first and second syntax elements.

88 Claims, 16 Drawing Sheets

(56) References Cited

U.S. PATENT DOCUMENTS

| | | | | |
|---|---|---|---|---|
| 7,224,844 | B2 | 5/2007 | Otsuka | |
| 7,292,163 | B1 * | 11/2007 | Fedele | 341/67 |
| 8,457,428 | B2 * | 6/2013 | Kimura | 382/248 |
| 2003/0202601 | A1 * | 10/2003 | Bjontegaard et al. | 375/240.22 |
| 2003/0219164 | A1 | 11/2003 | Otsuka | |
| 2004/0017855 | A1 | 1/2004 | Otsuka | |
| 2006/0115000 | A1 * | 6/2006 | Otsuka | 375/240.23 |
| 2008/0253443 | A1 * | 10/2008 | Mittal et al. | 375/240.01 |
| 2008/0291062 | A1 * | 11/2008 | Watanabe et al. | 341/51 |

FOREIGN PATENT DOCUMENTS

| | | |
|---|---|---|
| JP | 2004-056758 | 2/2004 |
| JP | 2004-179752 A | 6/2004 |

OTHER PUBLICATIONS

Iain E G Richardson, H.264/MPEG-4 Part 10: Variable-Length Coding, H.264/MPEG-4 Part 10 White Paper, Oct. 17, 2002, pp. 1-7.

Chien et al. (May 2006) "A high performance CAVLC encoder design for MPEG-4 AVC/H.264 video coding applications." Proc. 2006 IEEE Int'l Symp. on Circuits and Systems, pp. 3838-3841.*

International Telecommunications Union. (May 2003) "ITU-T Recommendation H.264: Advanced video coding for generic audiovisual services." pp. 157-164.*

Lai et al. (May 2005) "A simple and cost effective video encoder with memory-reducing CAVLC." Proc. 2005 IEEE Int'l Sym. on Circuits and Systems, vol. 1 pp. 432-435.*

Tsai et al. (Dec. 2006) "High performance context adaptive variable length coding encoder for MPEG-4 AVC/H.264 video coding." Proc. IEEE Asia Pacific Conf. on Circuits and Systems, pp. 586-589.*

Richardson, I.E.G. (2003) "H.264 and MPEG-4 video compression: video coding for next-generation multimedia." Chapter 6. Wiley, pp. 198-207.*

Japanese Patent Office. (2010) JPO Office Action in JP 2004-331107. Machine translation.*

Ihab Amer, Wael Badawy, and Graham Jullien, Towards Mpeg-4 Part 10 System on Chip: A Vlsi Prototype for Context-Based Adaptive Variable Length Coding (Cavlc), Signal Processing Systems, Oct. 2004, SIPS 2004, IEEE Workshop, p. 275-279.

* cited by examiner

| | | | |
|---|---|---|---|
| 1 | 2 | 3 | 4 |
| 5 | 6 | 7 | 8 |
| 9 | 10 | 11 | 12 |
| 13 | 14 | 15 | 16 |

RASTER SCAN ORDER

FIG. 2A

| | | | |
|---|---|---|---|
| 16 | 15 | 11 | 10 |
| 14 | 12 | 9 | 4 |
| 13 | 8 | 5 | 3 |
| 7 | 6 | 2 | 1 |

REVERSE SCAN ORDER

FIG. 2B

701

| | | | |
|---|---|---|---|
| 0 | 0 | -5 | 0 |
| 11 | 0 | 0 | 1 |
| 0 | 0 | 0 | 0 |
| 0 | -1 | 0 | 0 |

702

FIG. 7

CONTEXT-ADAPTIVE VARIABLE LENGTH CODER WITH SIMULTANEOUS STORAGE OF INCOMING DATA AND GENERATION OF SYNTAX ELEMENTS

Matter enclosed in heavy brackets [ ] appears in the original patent but forms no part of this reissue specification; matter printed in italics indicates the additions made by reissue.

FIELD OF THE INVENTION

The present invention relates to a variable-length coding apparatus for compressing an image signal.

BACKGROUND OF THE INVENTION

Recently, a method called H.264 is standardized as a motion image compression coding method. This H.264 coding method requires a larger operation amount than those of the conventional compression coding methods such as MPEG2 and MPEG4, but can realize a higher coding efficiency than those of these conventional methods.

In this H.264 coding method, a context adaptive variable-length coding (CAVLC) method is defined as a variable-length coding method. Syntax elements which form a coded stream in the CAVLC method are the number of nonzero data (to be referred to as TotalCoeff hereinafter) in a block, the number of zero data (to be referred to as TotalZeros hereinafter) input before the last nonzero data in a block, the number of data (to be referred to as TrailingOnes hereinafter) having an absolute value of 1 and input after the last data having an absolute value of 2 or more in a block, the value (to be referred to as Level hereinafter) of nonzero data, and the number of zero data (to be referred to as Run hereinafter) preceding to the nonzero data. Note that in the standard of H.264, the maximum value of TrailingOnes is defined as 3.

This CAVLC method largely differs from the variable-length coding method used in MPEG2 and MPEG4 in the following two points:

1. Level and Run are coded in the reverse scan order.

2. A variable-length coding table necessary for coding of Level and Run is changed in accordance with the calculation results of TotalCoeff, TrailingOnes, and TotalZeros.

An example of a variable-length coding apparatus using the CAVLC method is described in patent reference 1. This variable-length coding apparatus increases the processing speed by coding a plurality of data in parallel by variable-length coding, and sequentially connecting a plurality of generated variable-length coded data (e.g., Japanese Patent Laid-Open No. 2004-056758).

In this variable-length coding apparatus described in Japanese Patent Laid-Open No. 2004-056758, however, a plurality of syntax elements depend on each other, so the processing takes a long time if coding of a second syntax element cannot be started before the calculation of a first syntax element is completed.

For example, in the CAVLC method, after all image data in a block are read out and TotalCoeff, TrailingOnes, and TotalZeros are calculated, the Level and Run of all the image data in the block must be coded in turn from the beginning by variable-length coding. This makes the variable-length coding process time-consuming.

SUMMARY OF THE INVENTION

The present invention has been made in consideration of the above situation, and has as its object to increase the processing speed even when a plurality of syntax elements depend one each other.

According to the present invention, the foregoing object is attained by providing a variable-length coding apparatus which receives image data block by block, and generates coded data from syntax elements, comprising:

a storage unit that temporarily stores the image data;

a first syntax element calculating unit that calculates a first syntax element from the image data, at the same time the image data is stored in the storage unit;

a first coding unit that generates coded data of the first syntax element from a value of the first syntax element;

a second syntax element calculating unit that reads out the image data stored in the storage unit, and calculates a value of a second syntax element from the image data;

a second coding unit that generates coded data of the second syntax element on the basis of the values of the first and second syntax elements; and a packing unit that packs the coded data of the first and second syntax elements.

According to the present invention, the foregoing object is also attained by providing a variable-length coding method which receives image data block by block, and generates coded data from syntax elements, comprising:

temporarily storing the image data in a storage unit;

calculating a first syntax element from the image data, at the same time the image data is stored in the storage unit;

generating coded data of the first syntax element from a value of the first syntax element;

reading out the image data stored in the storage unit, and calculating a value of a second syntax element from the image data;

generating coded data of the second syntax element on the basis of the values of the first and second syntax elements; and connecting the coded data of the first and second syntax elements.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 2A and 2B are views showing the image data read orders;

FIG. 7 is a view showing an example of an image data block;

DETAILED DESCRIPTION OF THE PREFERRED EMBODIMENTS

Preferred embodiments of the present invention will now be described in detail in accordance with the accompanying drawings.

First Embodiment

Figure 1:
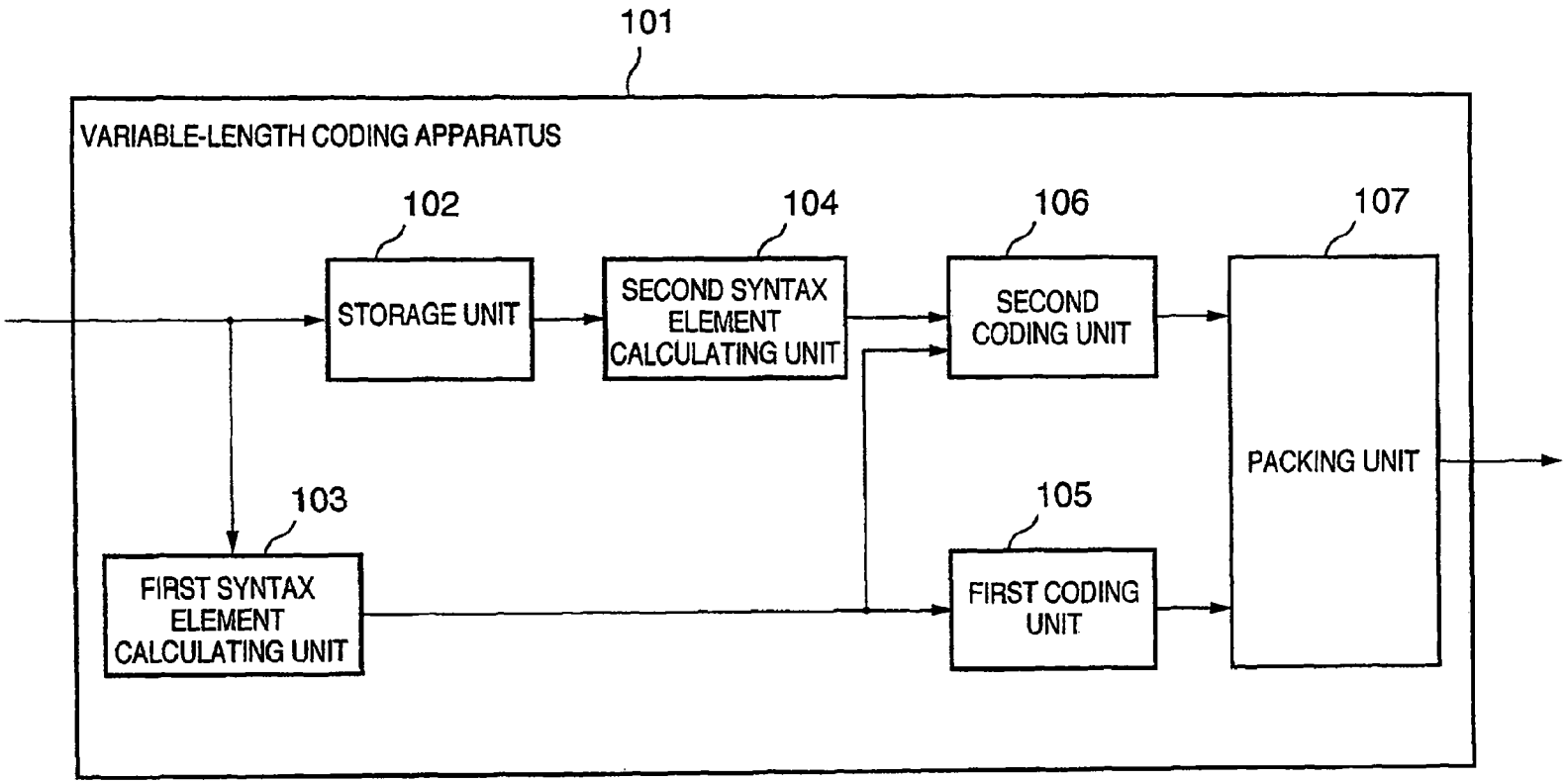
FIG. 1 is a view showing the arrangement of a variable-length coding apparatus according to the first embodiment.

FIG. 1 is a view showing the arrangement of the first embodiment of the present invention.

Referring to FIG. 1, a variable-length coding apparatus 101 according to the first embodiment includes a storage unit 102, first syntax element calculating unit 103, second syntax element calculating unit 104, first coding unit 105, second coding unit 106, and packing unit 107. The packing unit 107 packs variable-length coded data.

Image data of 4×4 rectangular blocks is input in a raster scan order shown in FIG. 2A to the variable-length coding apparatus 101.

The storage unit 102 is a RAM which temporarily stores the image data. Note that read or write to this RAM requires one cycle.

The first syntax element calculating unit 103 reads the image data in a block, calculates TotalCoeff, TrailingOnes, and TotalZeros in the block, and internally holds the calculated syntax elements.

The second syntax element calculating unit 104 reads out the image data held in the storage unit 102 in a reverse zigzag scan order shown in FIG. 2B, and calculates Level and Run of each image data in the block.

The first coding unit 105 performs variable-length coding, by using a predetermined variable-length coding table, on TotalCoeff, TrailingOnes, and TotalZeros calculated by the first syntax element calculating unit 103.

The second coding unit 106 selects a variable-length coding table on the basis of TotalCoeff, TrailingOnes, and TotalZeros calculated by the first syntax element calculating unit 103, and, by using the selected variable-length coding table, performs variable-length coding on Level and Run of each image data calculated by the second syntax element calculating unit 104.

The packing unit 107 shifts and packs the variable-length codes of the output individual syntax elements from the first and second coding units 105 and 106 in accordance with a predetermined format, thereby generating one variable-length stream data.

Figure 3:
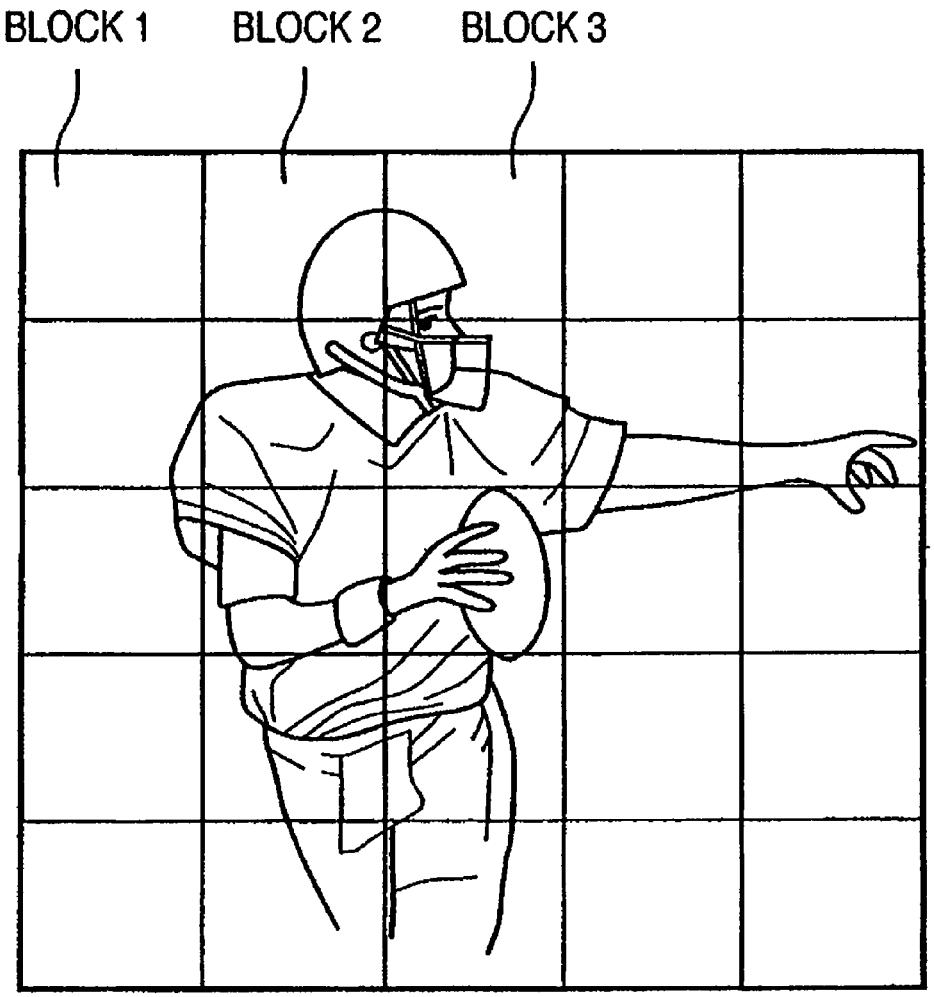
FIG. 3 is a view showing an example of image data.

The flow of data when image data shown in FIG. 3 is coded by variable-length coding will be explained below.

Figure 4:
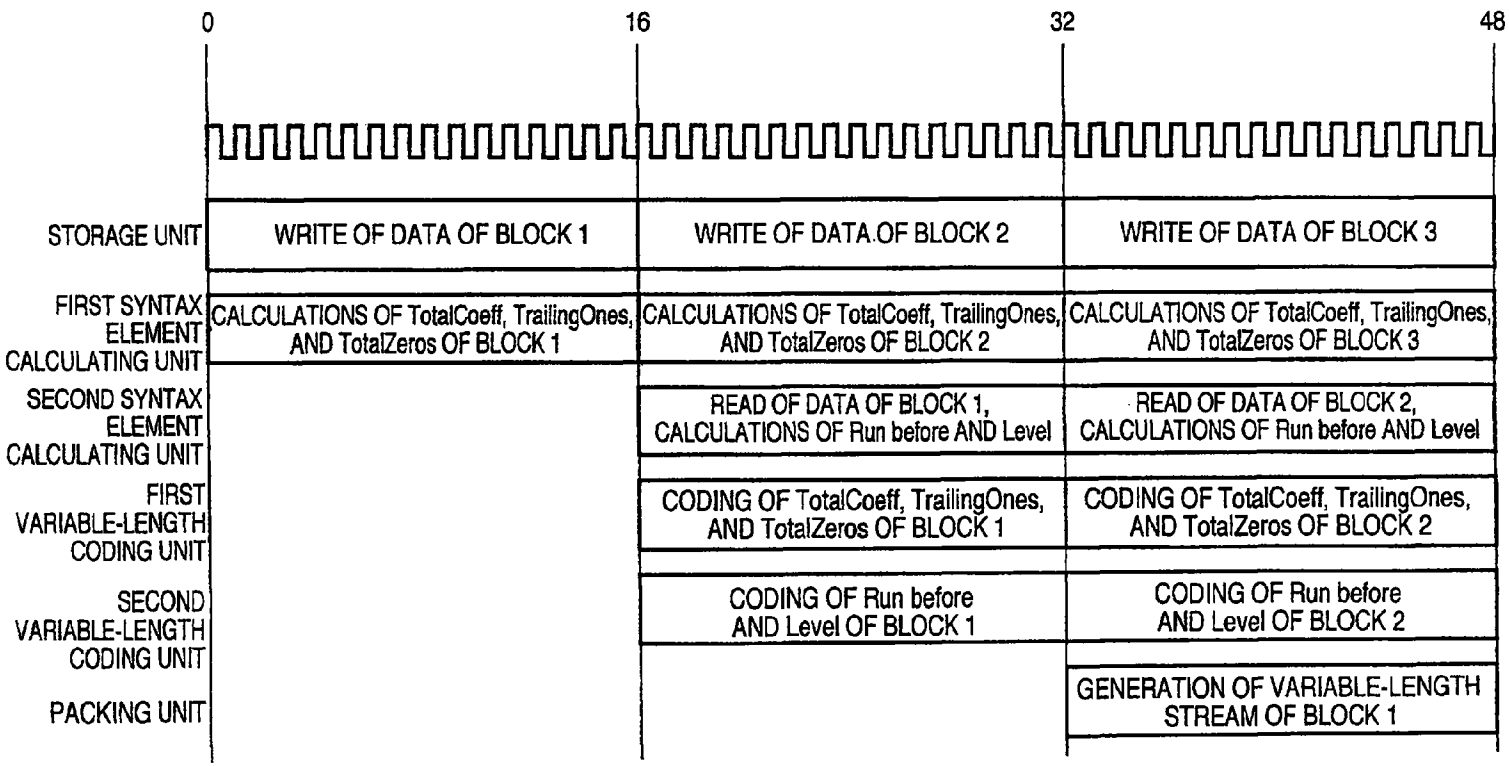
FIG. 4 is a timing chart showing the operation of each circuit according to the first embodiment.

FIG. 4 is a timing chart showing processing performed by each unit shown in FIG. 1 with respect to time.

From time 0, image data of block 1 shown in FIG. 3 are input one at each cycle to the variable-length coding apparatus 101, and written in the storage unit 102. Since the block is made up of 4×4 image data, write of all the image data of block 1 requires 16 cycles.

The image data are also input to the first syntax element calculating unit 103 at the same time they are written in the storage unit 102. Immediately after all the image data are input, the first syntax element calculating unit 103 calculates the values of TotalCoeff, TrailingOnes, and TotalZeros, and outputs the calculated values.

Subsequently, from time 16 to time 32, the second syntax element calculating unit 104 reads out the image data of block 1 one at each cycle in a reverse zigzag scan order from the storage unit 102, and calculates the values of Run and Level of each image data. Immediately after nonzero data is input, the second syntax element calculating unit 104 inputs the values of Level and Run of the data to the second coding unit 106.

Also, TotalCoeff, TrailingOnes, and TotalZeros calculated before time 16 are input to the first coding unit 105, and coded by variable-length coding in one cycle by using a predetermined variable-length coding table. The value of TrailingOnes is held because it is necessary to select a variable-length coding table of the next block. The variable-length coded data is input to the packing unit 107, and held until time 32.

In addition, from time 16 to time 32, the second coding unit 106 selects a variable-length coding table necessary for coding of Run and Level on the basis of the values of TotalCoeff, TrailingOnes, and TotalZeros input from the first syntax element calculating unit 103. The second coding unit 106 performs variable-length coding on Run and Level of each image data in one cycle by using the selected variable-length coding table. Assume that coding of Run and coding of Level are performed in parallel. The variable-length coded data is input to the packing unit 107, and held until time 32.

In parallel with this processing, image data of block 2 shown in FIG. 3 are written in the storage unit 102. In addition, the first syntax element calculating unit 103 calculates TotalCoeff, TrailingOnes, and TotalZeros of block 2 in the same manner as for block 1.

Then, from time 32 to time 48, the packing unit 107 reads out the variable-length codes input from the first and second coding units 105 and 106, connects and packs the readout codes, and outputs a coded stream defined by the H.264 standard.

In parallel with this processing, the second syntax element calculating unit 104 calculates Run and Level of each image data of block 2 in the same manner as for block 1. Also, the first and second coding units 105 and 106 perform variable-length coding of each syntax element of block 2 in the same manner as for block 1.

Furthermore, in parallel with this processing, image data of block 3 shown in FIG. 3 are written in the storage unit 102. The first syntax element calculating unit 103 calculates TotalCoeff, TrailingOnes, and TotalZeros of block 3 in the same manner as for block 1. The same processing is repeated for all blocks to process one data at each cycle.

Details of the method of calculating each syntax element will be explained below.

Figure 5:
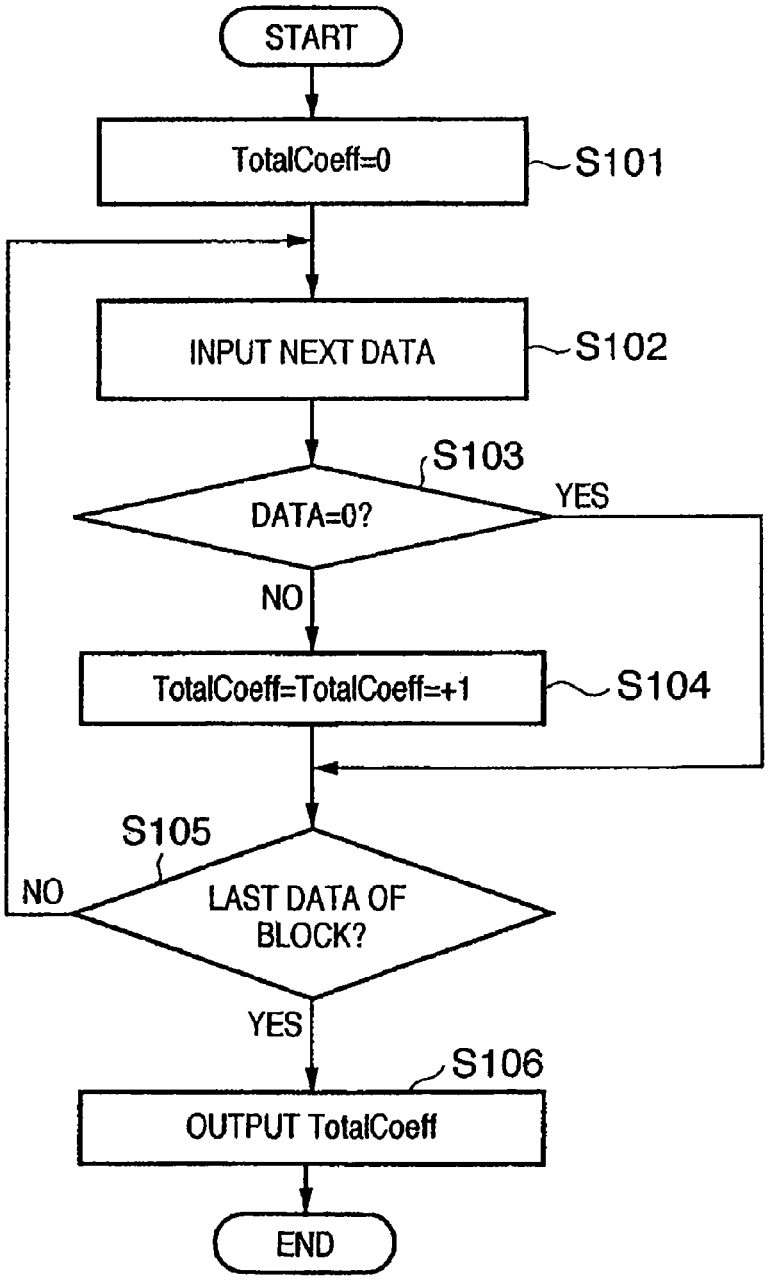
FIG. 5 is a flowchart showing a method of calculating TotalCoeff.

First, the operation of calculating TotalCoeff performed by the first syntax element calculating unit 103 will be explained below with reference to a flowchart shown in FIG. 5.

In step S101, a variable TotalCoeff is initialized to 0. In step S102, the next image data in the block is input, and the flow advances to step S103.

In step S103, whether the value of the image data is zero is determined. If the value is not zero, the flow advances to step S104 to add 1 to the value of TotalCoeff, and further advances to step S105.

If the value is zero, the flow advances to step S105. In step S105, whether the present image data is the last data of the block is determined. If the image data is the last data of the block, the flow advances to step S106 to output the present value of TotalCoeff as a calculation result, and terminate the processing for the present block. If the image data is not the last data of the block, the flow returns to step S102 to input the next image data.

Figure 6:
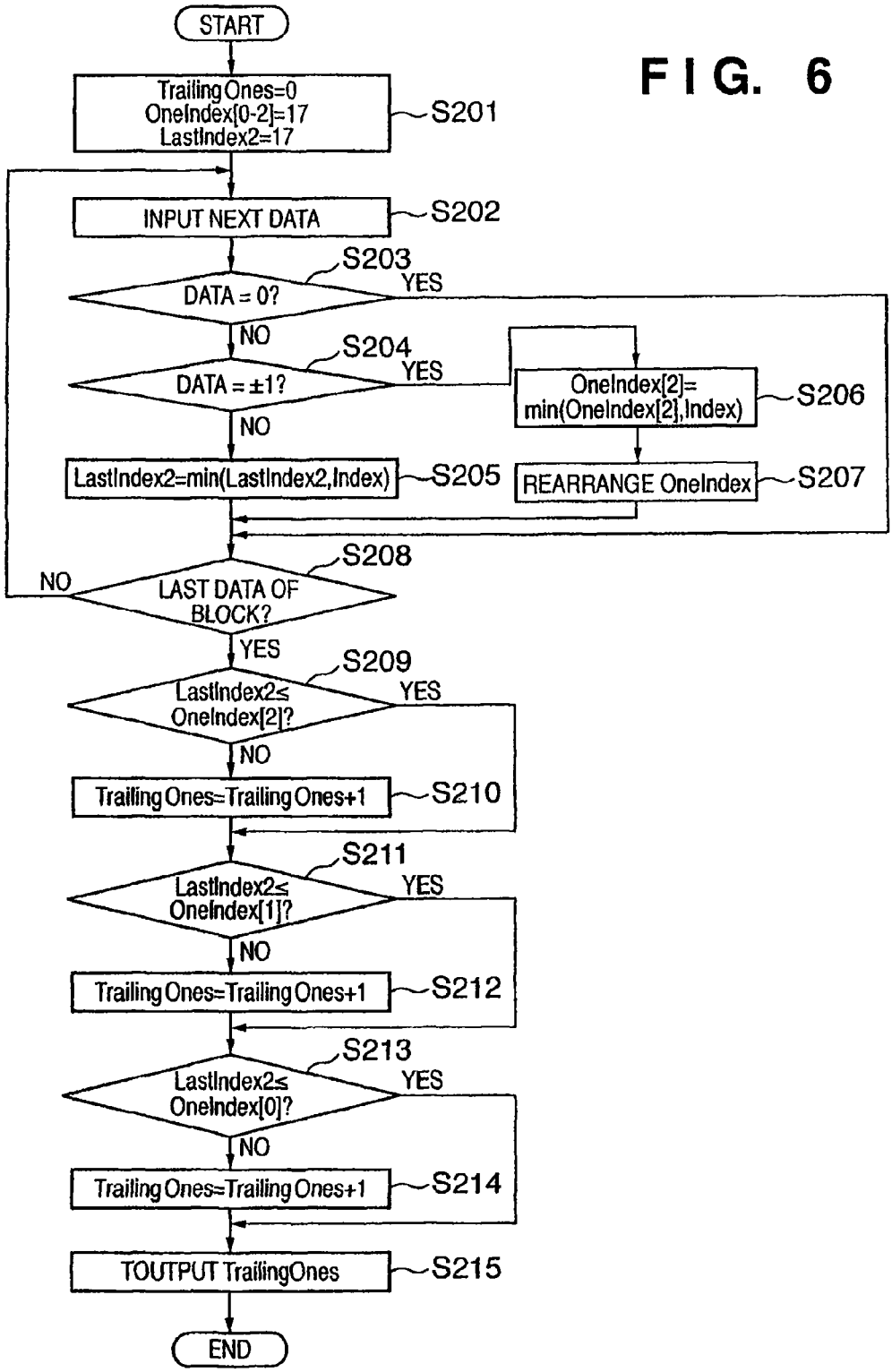
FIG. 6 is a flowchart showing a method of calculating TrailingOnes.

The operation of calculating TrailingOnes performed by the first syntax element calculating unit 103 will be explained below with reference to a flowchart shown in FIG. 6.

First, in step S201, a variable TrailingOnes is initialized to 0. Also, a variable LastIndex2 and each element of an array OneIndex including three elements are initialized to 17. Note that in this explanation of the flowchart shown in FIG. 6, a number indicating the order when each image data input in a raster scan order is read out in a reverse zigzag scan order is defined as an index. For example, in a block shown in FIG. 7, the index of image data 701 is 16, and that of image data 702 is 10.

LastIndex2 is a variable representing the minimum value of the index of image data having an absolute value of 2 or more in the block. Also, the array OneIndex stores three indices, in ascending order from the smallest one, of image data having an absolute value of 1 in the block.

In step S202, the next image data in the block is input, and the flow advances to step S203. In step S203, whether the value of the image data is zero is determined. If the value is zero, the flow advances to step S208. If the value is not zero, the flow advances to step S204 to determine whether the absolute value of the image data is 1.

If the absolute value of the image data is not 1, the flow advances to step S205 to compare the value of LastIndex2 with the index value of the presently input image data, and substitute a smaller value into LastIndex2.

If the absolute value of the image data is 1 in step S204, the flow advances to step S206 to compare the value of an array OneIndex[2] with the index value of the presently input image data, and substitute a smaller value into OneIndex[2]. After that, the flow advances to step S207.

In step S207, the values of OneIndex[0], OneIndex[1], and OneIndex[2] are compared, and the values of these arrays are rearranged such that the minimum value is OneIndex[0] and the maximum value is OneIndex[2].

In step S208, whether the present image data is the last data of the block is determined. If the image data is not the last data of the block, the flow returns to step S202 to input the next image data. If the image data is the last data of the block, the flow advances to step S209. In step S209, the value of LastIndex2 is compared with OneIndex[2]. If OneIndex[2] is smaller, the flow advances to step S210 to add 1 to TrailingOnes. If LastIndex2 is smaller or the two values are equal, the flow advances to step S211.

Subsequently, in step S211, the value of LastIndex2 is compared with OneIndex[1]. If OneIndex[1] is smaller, the flow advances to step S212 to add 1 to TrailingOnes. If LastIndex2 is smaller or the two values are equal, the flow advances to step S213.

In step S213, the value of LastIndex2 is compared with OneIndex[0]. If OneIndex[0] is smaller, the flow advances to step S214 to added 1 to TrailingOnes. If LastIndex2 is smaller or the two values are equal, the flow advances to step S215.

Finally, in step S215, the present value of TrailingOnes is output as a calculation result, and the processing for the present block is completed.

Figure 8:
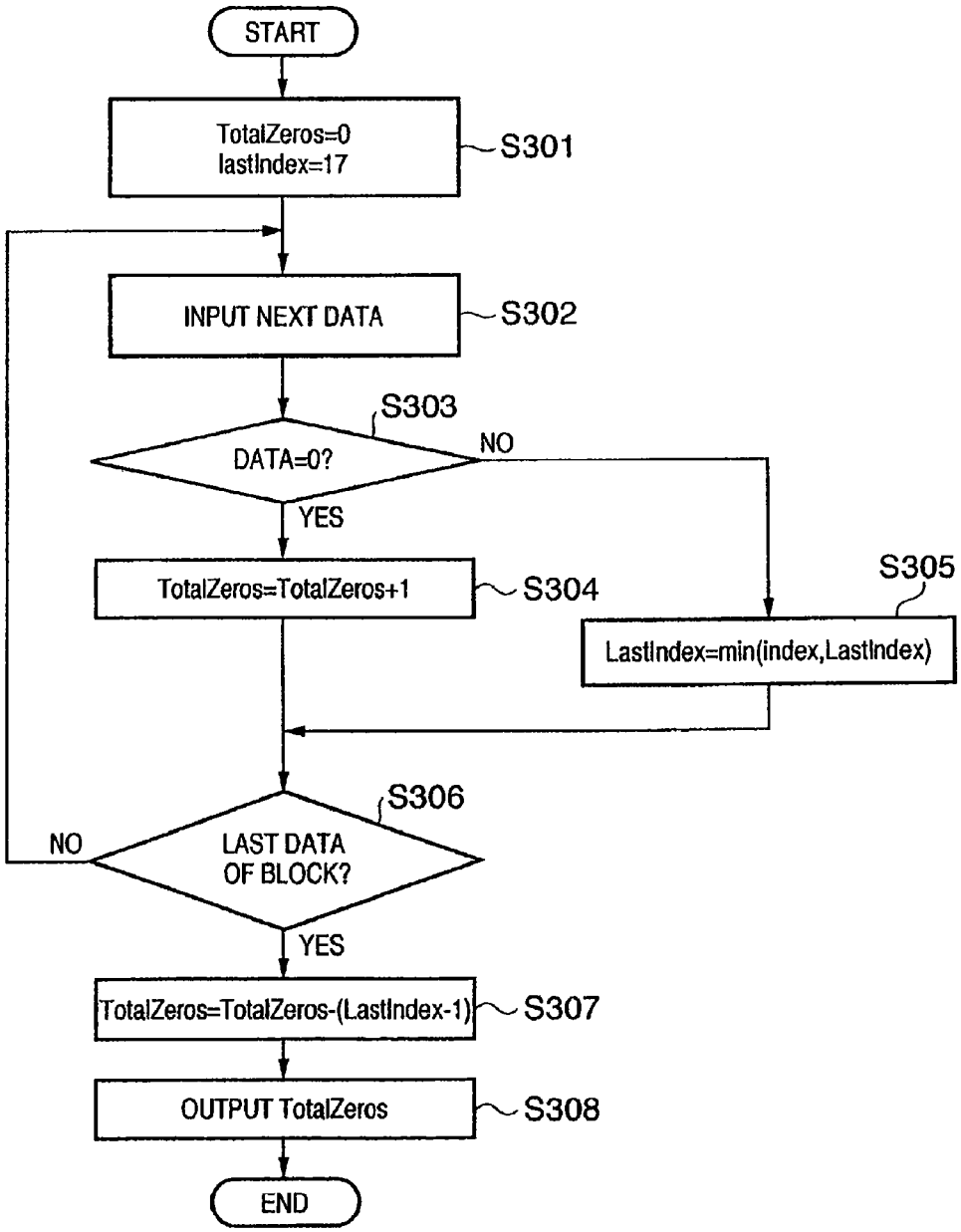
FIG. 8 is a flowchart showing a method of calculating TotalZeros.

The operation of calculating TotalZeros performed by the first syntax element calculating unit 103 will be explained below with reference to a flowchart shown in FIG. 8.

First, in step S301, a variable TotalZeros is initialized to 0. Also, a variable LastIndex is initialized to 17. Note that LastIndex is a variable representing the minimum value of the index of image data having an absolute value of 1 or more in the block.

Then, in step S302, the next image data in the block is input, and the flow advances to step S303. In step S303, whether the value of the image data is zero is determined. If the value is zero, the flow advances to step S304 to add 1 to TotalZeros. If the value is not zero, the flow advances to step S305.

In step S305, the value of LastIndex is compared with the index value of the presently input image data, and a smaller value is substituted into LastIndex. After that, the flow advances to step S306.

In step S306, whether the present image data is the last data of the block is determined. If the image data is the last data of the block, the flow advances to step S307 to subtract the value of LastIndex-1 from TotalZeros.

Subsequently, the flow advances to step S308 to output the present value of TotalZeros as a calculation result, and terminate the processing for the present block. If it is determined in step S306 that the image data is not the last data of the block, the flow returns to step S302 to input the next image data.

By the method described above, the first syntax element calculating unit 103 can calculate the values of TotalCoeff, TrailingOnes, and TotalZeros immediately after the last image data in the block is input to the storage unit 102.

Figure 9:
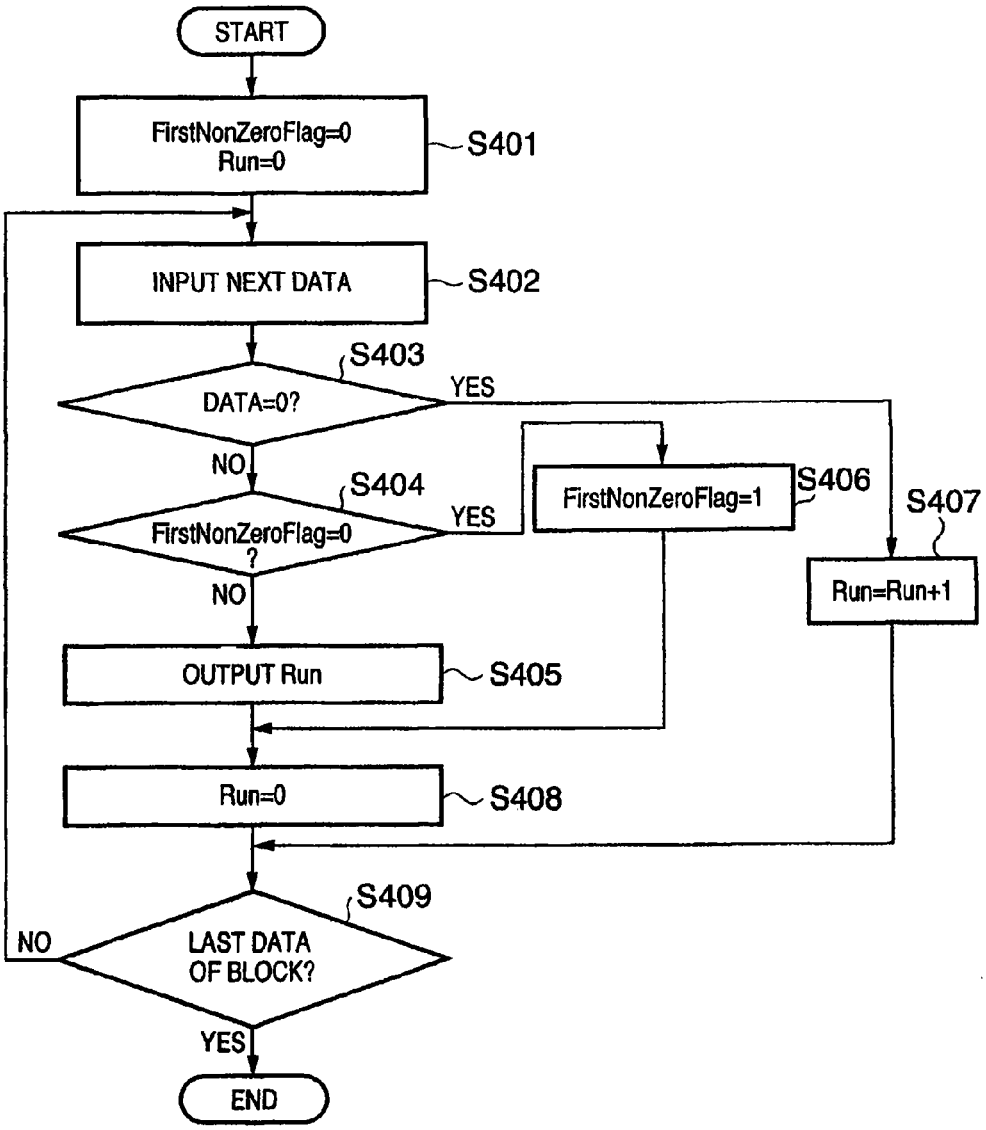
FIG. 9 is a flowchart showing a method of calculating Run.

The operation of calculating Run performed by the second syntax element calculating unit 104 will be explained below with reference to a flowchart shown in FIG. 9.

First, in step S401, variables Run and FirstNonZeroFlag are initialized to 0. Note that FirstNonZeroFlag is a flag which is 1 when at least one nonzero image data in the block is input, and 0 if no nonzero image data has been input yet.

Then, in step S402, the next image data in the block is input, and the flow advances to step S403. In step S403, whether the value of the image data is zero is determined. If the value is not zero, the flow advances to step S404 to determine whether the value of FirstNonZeroFlag is zero. If the value is not zero, the flow advances to step S405 to output the present value of Run, and further advances to step S408. If it is determined in step S404 that the value is zero, the flow advances to step S406. In step S406, FirstNonZeroFlag is set to 1, and the flow further advances to step S408. When it is determined in step S403 that the value of the image data is zero, the flow advances to step S407 to add 1 to Run, and then advances to step S408.

In step S408, zero is substituted into Run, and the flow advances to step S409. Note that if the value of the image data is zero in step S403, the flow advances to step S407 to add 1 to Run, and then advances to step S409.

In step S409, whether the present image data is the last data of the block is determined. If the image data is the last data of the block, the processing for the present block is terminated. If the present image data is not the last data of the block, the flow returns to step S402 to input the next image data.

Figure 10:
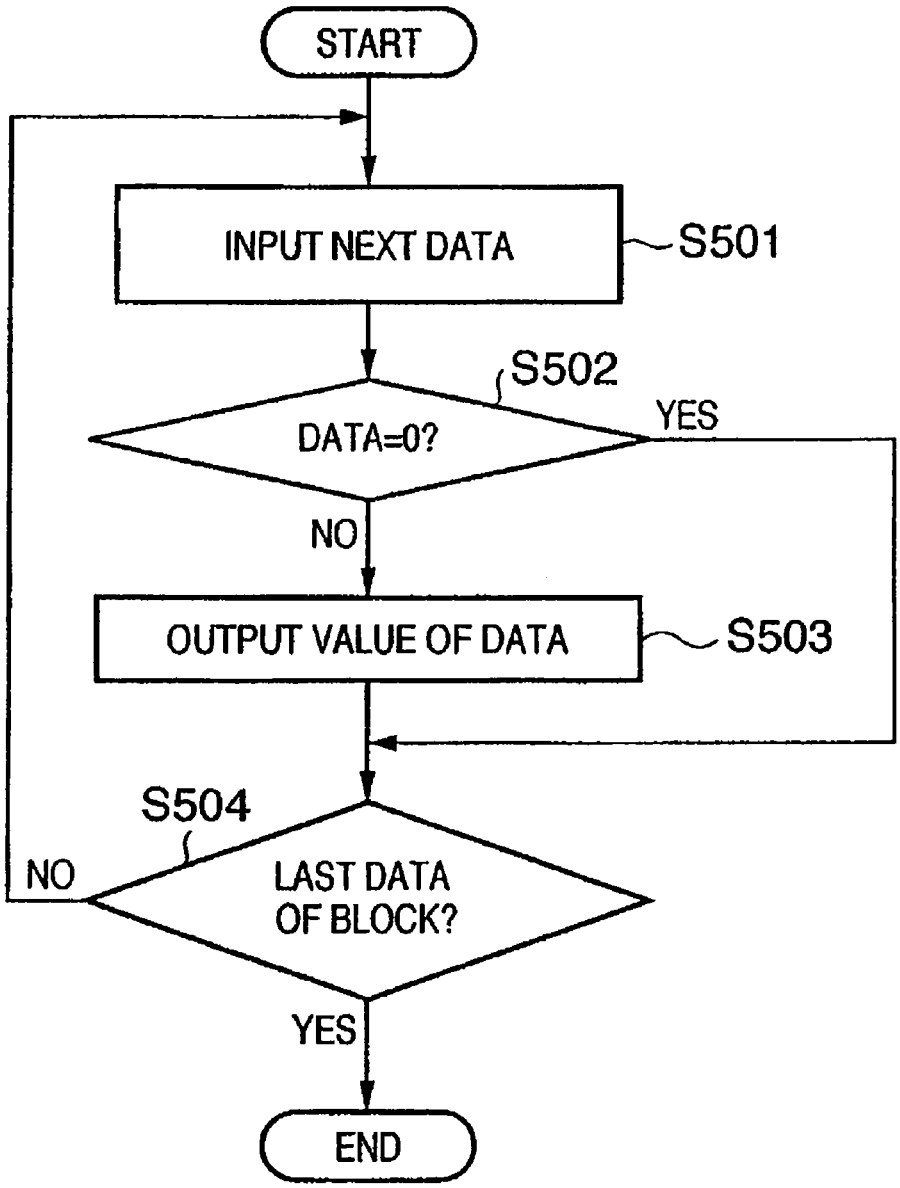
FIG. 10 is a flowchart showing a method of calculating Level.

The operation of calculating Level performed by the second syntax element calculating unit 104 will be explained below with reference to a flowchart shown in FIG. 10.

In step S501, the next image data in the block is input, and the flow advances to step S502. In step S502, whether the value of the image data is zero is determined. If the value is zero, the flow advances to step S504. If the value is not zero, the flow advances to step S503. In step S503, the value of the presently input data is output as Level, and the flow advances to step S504.

In step S504, whether the present image data is the last data of the block is determined. If the image data is the last data of the block, the processing for the present block is terminated. If the image data is not the last data of the block, the flow returns to step S501 to input the next image data.

In the first embodiment of the present invention as described above, the second syntax element calculating unit 104 can read out image data in a block from the storage unit 102 and calculate the values of Run and Level at the same time.

On the basis of the first syntax elements calculated by the first syntax element calculating unit 103, the second coding unit 106 selects one of a plurality of predetermined variable-length coding tables, and performs variable-length coding of Run and Level. Since the values of TotalCoeff, TrailingOnes, and TotalZeros are calculated in advance, variable-length coding of Run and Level can be performed immediately after each image data in the block is read out by the second syntax element calculating unit 104.

In parallel with this processing, the first coding unit 105 performs variable-length coding on TotalCoeff, TrailingOnes, and TotalZeros. As a consequence, variable-length codes of all syntax elements can be obtained in the same clock cycle as when read of image data in the block from the storage unit 102 is completed.

Second Embodiment

The second embodiment of the present invention will be described below.

The second embodiment differs from the first embodiment in the following respect. In the first embodiment, the first syntax element calculating unit calculates the values of the first syntax elements directly from image data input to the storage unit. In the second embodiment, however, the value of additional information is calculated from image data, and a first syntax element calculating unit calculates the values of first syntax elements by using this additional information and data read out from a storage unit.

Figure 11:
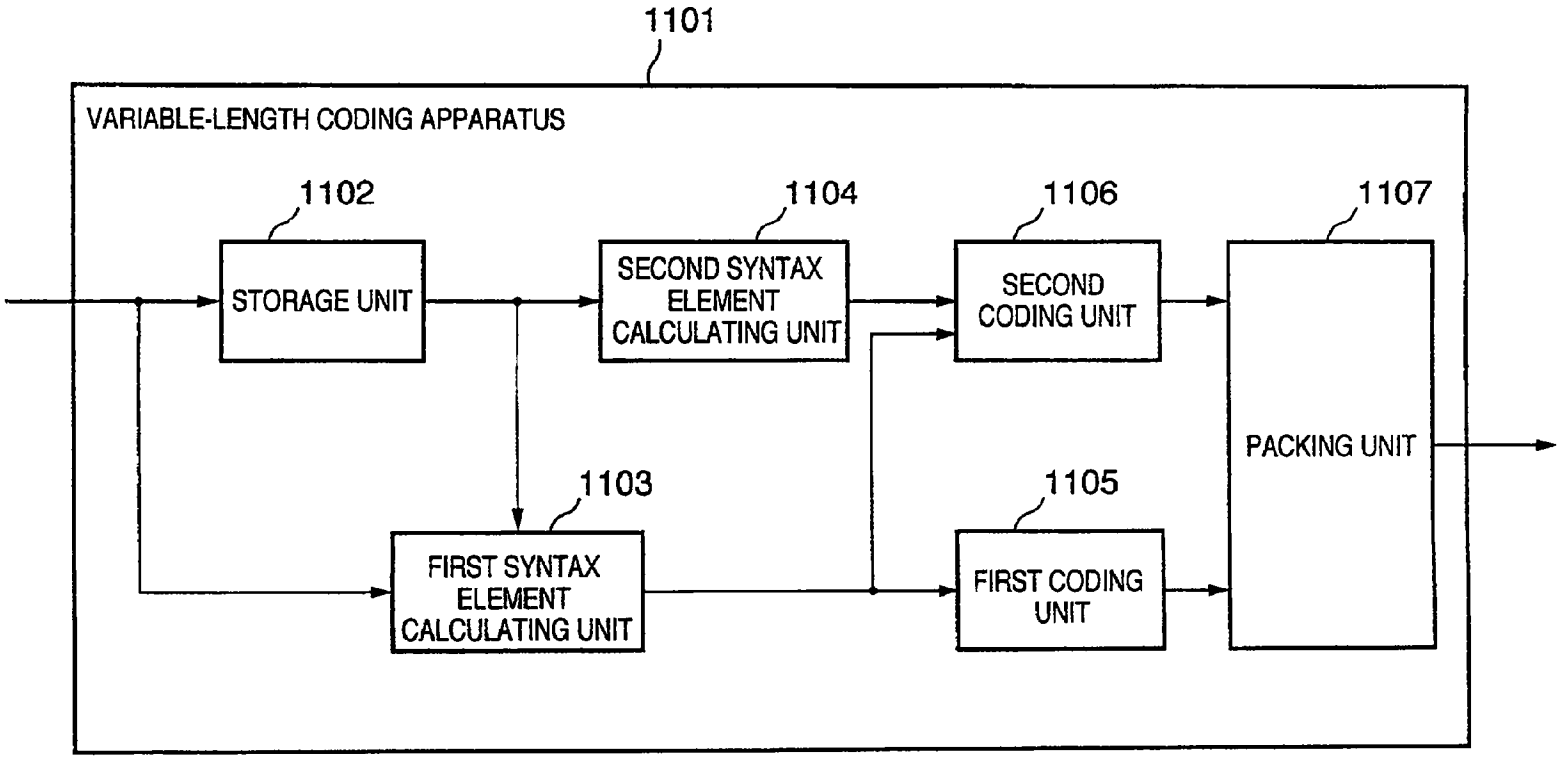
FIG. 11 is a view showing the arrangement of a variable-length coding apparatus according to the second embodiment.

FIG. 11 is a view showing the arrangement of the second embodiment of the present invention. Referring to FIG. 11, a variable-length coding apparatus 1101 according to the present invention includes a storage unit 1102, first syntax element calculating unit 1103, second syntax element calculating unit 1104, first coding unit 1105, second coding unit 1106, and packing unit 1107. The packing unit 107 connects variable-length coded data. Note that the variable-length coding apparatus 1101, storage unit 1102, second syntax element calculating unit 1104, first and second coding units 1105 and 1106, and packing unit 1107 are the same as in the first embodiment, so an explanation thereof will be omitted.

The first syntax element calculating unit 1103 calculates additional information necessary to calculate the values of first syntax elements at the same time image data is input to the storage unit 1102. After that, when reading out image data from the storage unit 1102, the first syntax element calculating unit 1103 calculates the values of the first syntax elements by using the additional information.

Figure 12:
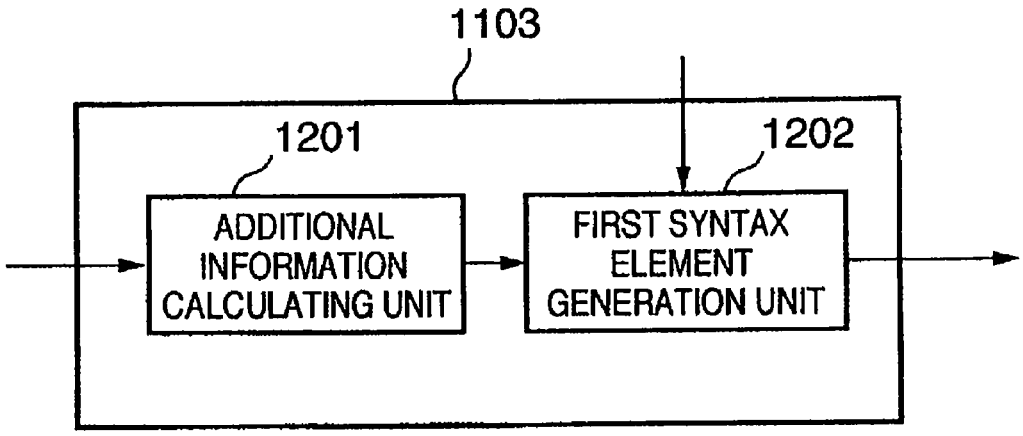
FIG. 12 is a view showing the internal arrangement of a first syntax element calculating unit in the variable-length coding apparatus according to the second embodiment.

FIG. 12 shows the internal arrangement of the first syntax element calculating unit 1103. The first syntax element calculating unit 1103 contains an additional information calculating unit 1201 and first syntax element generation unit 1202.

The additional information calculating unit 1201 calculates the number of zero data and the number of nonzero data as additional information from each image data in a block which is input in a raster scan order to the variable-length coding apparatus 1101.

The first syntax element generation unit 1202 calculates the values of TotalCoeff, TrailingOnes, and TotalZeros necessary to code second syntax elements, from data read out in a reverse zigzag scan order from the storage unit 1102 and the additional information calculated by the additional information calculating unit 1201.

The flow of data when image data shown in FIG. 3 is coded by variable-length coding will be explained below.

Figure 13:
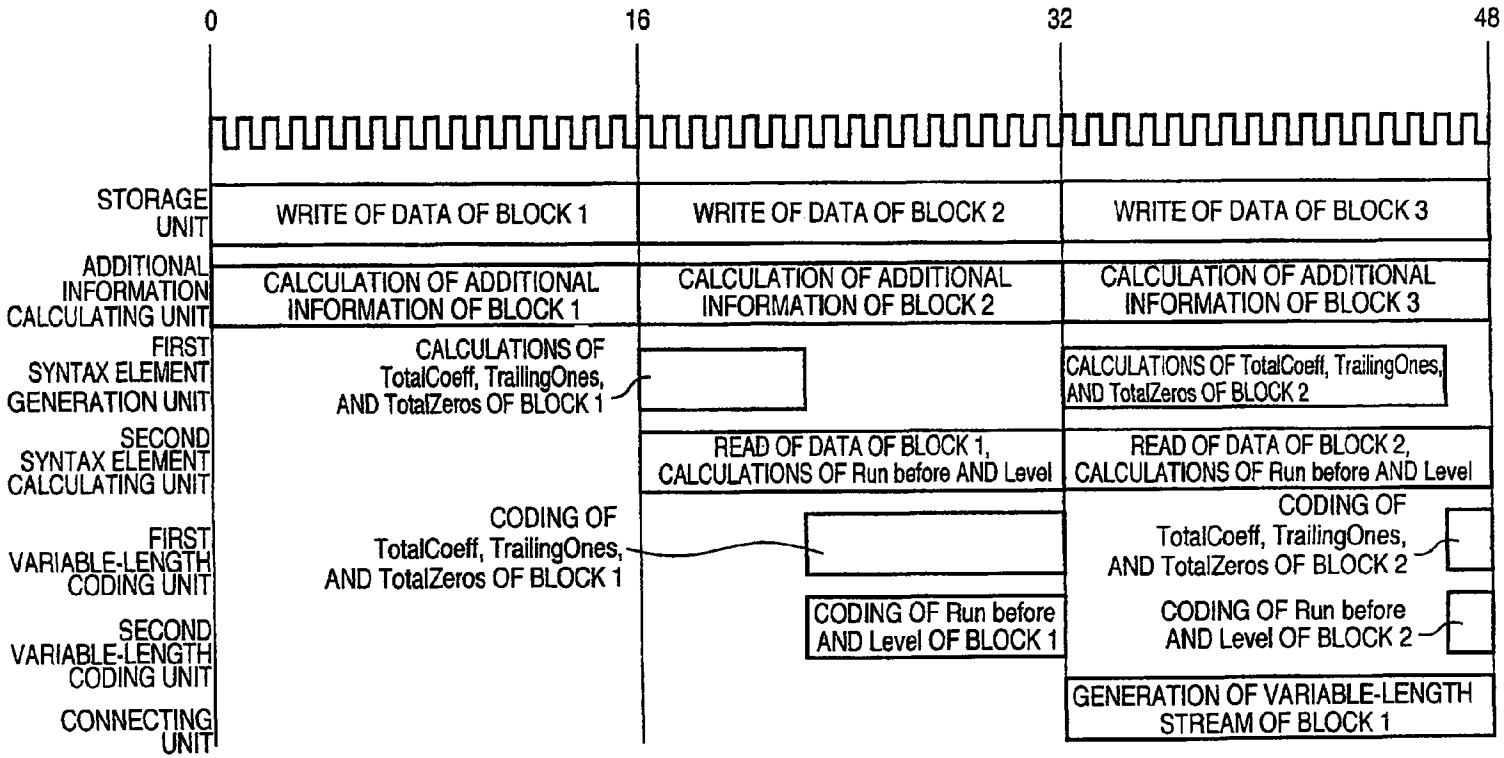
FIG. 13 is a timing chart showing the operation of each circuit according to the second embodiment of the present invention.

FIG. 13 is a timing chart showing processing performed by each unit shown in FIG. 11 with respect to time. From time 0, image data of block 1 shown in FIG. 3 are input one at each cycle to the variable-length coding apparatus 1101, and written in the storage unit 1102. Since the block is made up of 4×4 image data, write of all the image data of block 1 requires 16 cycles.

At the same time the image data are written in the storage unit 1102, they are also input to the additional information calculating unit 1201 where the number of zero data and the number of nonzero data in block 1 are calculated as additional information. Immediately after all the image data are input, the additional information calculating unit 1201 outputs the calculation results.

Subsequently, from time 16 to time 32, the first syntax element generation unit 1202 reads out the image data of block 1 one at each cycle in a reverse zigzag scan order from the storage unit 1102. On the basis of the additional information calculated by the additional information calculating unit 1201 and the readout image data, the first syntax element generation unit 1202 calculates TotalCoeff, TrailingOnes, and TotalZeros as first syntax elements of block 1.

When first data having an absolute value of 2 or more is read out, or when three data having an absolute value of 1 are read out, the first syntax element generation unit 1202 completes the synthesis of the first syntax elements of block 1. For example, if the data as shown in FIG. 7 is input, the first syntax elements can be calculated when −5 is input at time 27.

Also, the second syntax element calculating unit 1104 reads out the image data of block 1 one at each cycle in a reverse zigzag scan order from the storage unit 1102, and calculates the values of Run and Level of each image data. Immediately after nonzero data is input, the second syntax element calculating unit 1104 inputs the values of Level and Run of the data to the second coding unit 1106.

In addition, TotalCoeff, TrailingOnes, and TotalZeros calculated before time 27 are input to the first coding unit 1105, and coded by variable-length coding in one cycle by using a predetermined variable-length coding table. The value of TrailingOnes is held because it is necessary to select a variable-length coding table of the next block. The variable-length coded data is input to the packing unit 1107, and held until time 32.

Furthermore, from time 27 to time 32, the second coding unit 1106 selects a variable-length coding table necessary for coding of Run and Level on the basis of the values of Total- Coeff, TrailingOnes, and TotalZeros input from the first syntax element generation unit 1202. The second coding unit 1106 performs variable-length coding of Run and Level of each image data by using the selected variable-length coding table. Assume that the second coding unit 1106 performs coding of Run and coding of Level in parallel. The variable-length coded data is input to the packing unit 1107, and held until time 32.

In parallel with this processing, image data of block 2 shown in FIG. 3 are written in the storage unit 1102. The additional information calculating unit 1201 calculates the number of zero data and the number of nonzero data of block 2 in the same manner as for block 1.

Then, from time 32 to time 48, the packing unit 1107 reads out the variable-length codes input from the first and second coding units 1105 and 1106, connects and packs the readout codes, and outputs a coded stream.

In parallel with this processing, the first syntax element generation unit 1202 calculates TotalCoeff, TrailingOnes, and TotalZeros of block 2 in the same manner as for block 1.

Furthermore, the second syntax element calculating unit 1104 calculates the values of Run and Level of each image data of block 2 in the same manner as for block 1. Also, the first and second coding units 1105 and 1106 perform variable-length coding of each syntax element of block 2 in the same manner as for block 1.

In parallel with this processing, image data of block 3 shown in FIG. 3 are written in the storage unit 1102. The additional information calculating unit 1201 calculates the number of zero data and the number of nonzero data of block 3 in the same manner as for block 1. The same processing is repeated for all blocks to process one data at each cycle.

Figure 14:
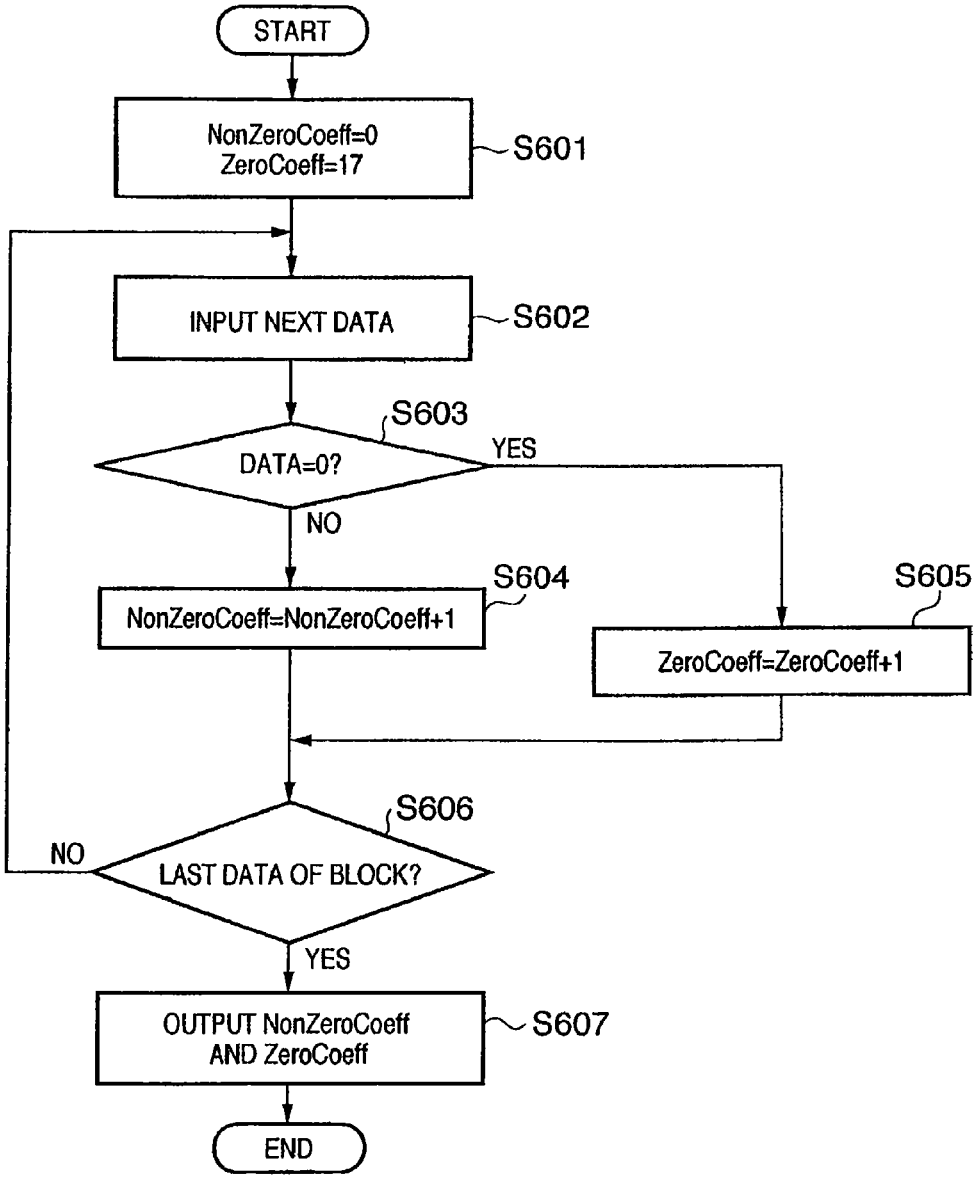
FIG. 14 is a flowchart showing a method of calculating additional information.

A method of calculating the additional information performed by the additional information calculating unit 1201 will be explained below with reference to FIG. 14.

First, in step S601, variables NonZeroCoeff and ZeroCoeff are initialized to 0. Note that NonZeroCoeff is a variable representing the number of nonzero data in the block, and ZeroCoeff is a variable representing the number of zero data in the block.

Then, in step S602, the next image data in the block is input, and the flow advances to step S603. In step S603, whether the value of the image data is zero is determined. If the value is not zero, the flow advances to step S604 to add 1 to the value of NonZeroCoeff, and further advances to step S606. If the value is zero, the flow advances to step S605 to add 1 to the value of ZeroCoeff, and further advances to step S606.

In step S606, whether the present image data is the last data of the block is determined. If the image data is the last data of the block, the flow advances to step S607. In step S607, the present values of NonZeroCoeff and ZeroCoeff are output as calculation results, and the processing for the present block is terminated. If the image data is not the last data of the block, the flow returns to step S602 to input the next image data. Note that in this embodiment, the values of NonZeroCoeff and ZeroCoeff are calculated by counting both zero data and nonzero data. However, it is also possible to count only one of zero data and nonzero data and calculate the other by subtracting the count from the number of image data of the block.

A method of synthesizing the values of first syntax elements performed by the first syntax element generation unit 1202 will be explained below.

The value of TotalCoeff is the same as NonZeroCoeff calculated by the additional information calculating unit 1201, so the value of NonZeroCoeff is directly output.

Figure 15:
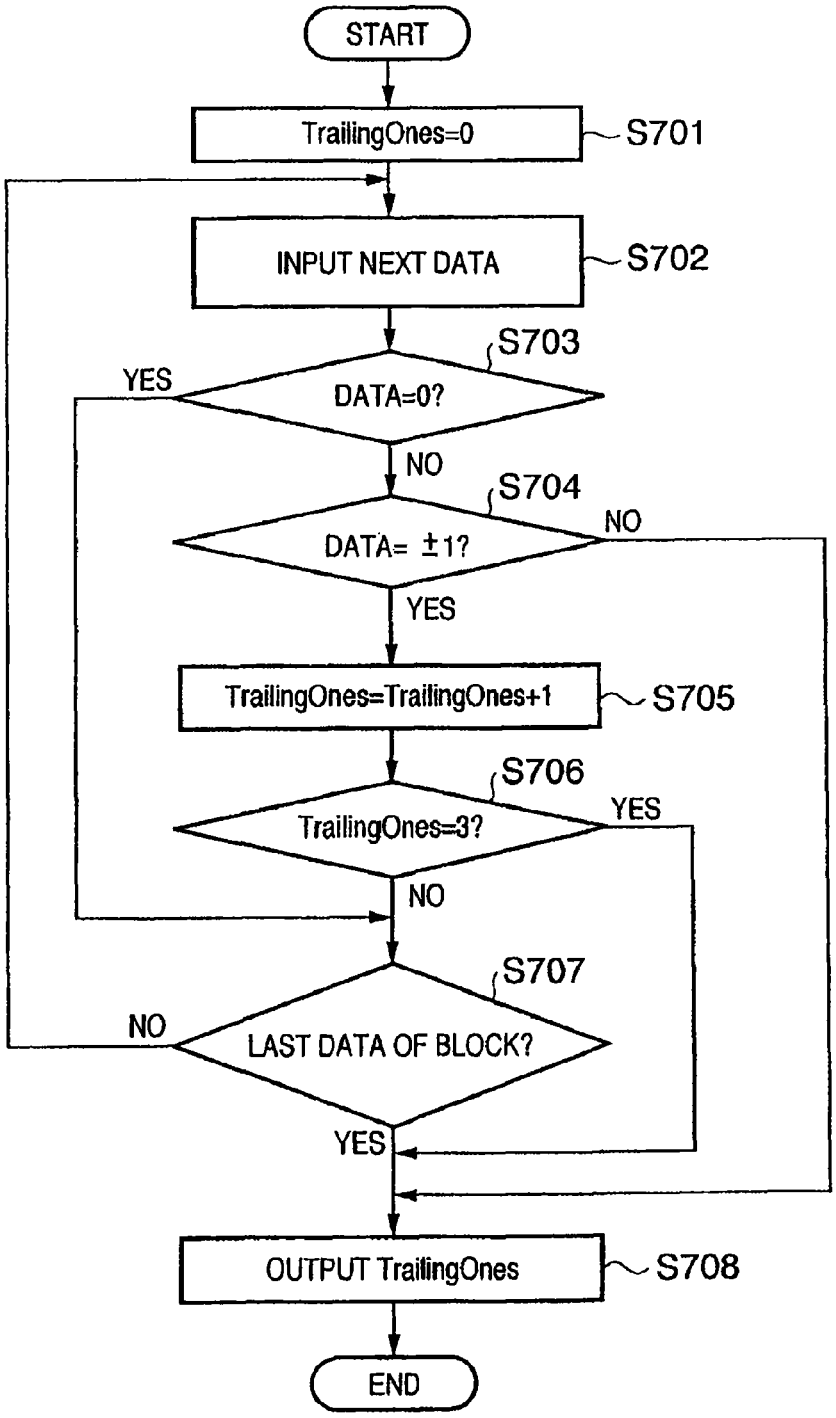
FIG. 15 is a flowchart showing a method of calculating TrailingOnes.

The operation of calculating TrailingOnes will be explained below with reference to a flowchart shown in FIG. 15.

First, in step S701, a variable TrailingOnes is initialized to 0.

Then, in step S702, the next image data in the block is input, and the flow advances to step S703. In step S703, whether the value of the image data is zero is determined. If the value is zero, the flow advances to step S707. If the value is not zero, the flow advances to step S704. In step S704, whether the absolute value of the image data is 1 is determined.

If it is determined in step S704 that the absolute value of the image data is not 1, the flow advances to step S708 to output the present value of TrailingOnes and terminate the processing.

If it is determined in step S704 that the absolute value of the image data is 1, the flow advances to step S705 to add 1 to TrailingOnes, and further advances to step S706. If the value of TrailingOnes is 3 in step S706, the flow advances to step S708 to output the present value of TrailingOnes and terminate the processing. If the value of TrailingOnes is 2 or less, the flow advances to step S707.

In step S707, whether the present image data is the last data of the block is determined. If the image data is not the last data of the block, the flow returns to step S702 to input the next image data. If the image data is the last data of the block, the flow advances to step S708 to output the present value of TrailingOnes and terminate the processing.

Figure 16:
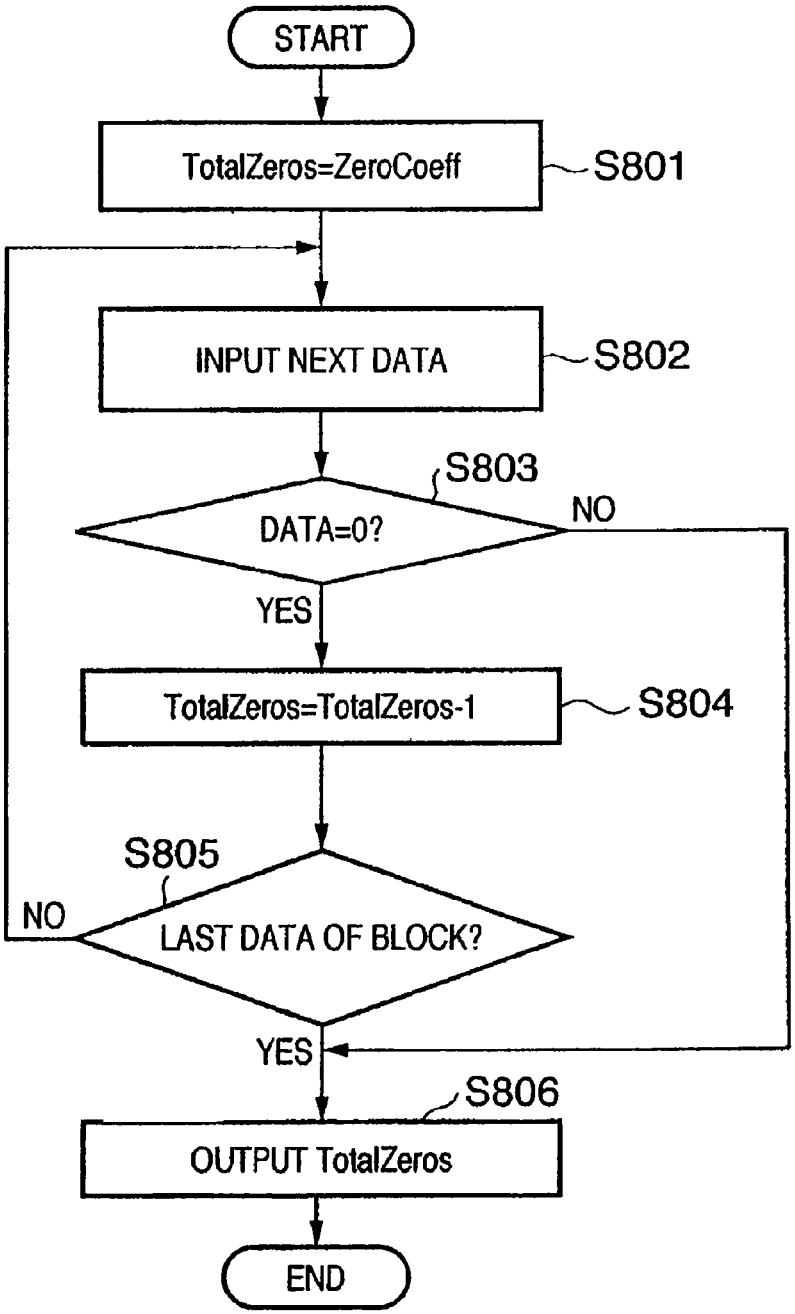
FIG. 16 is a flowchart showing a method of calculating TotalZeros.

The operation of calculating TotalZeros will be explained below with reference to a flowchart shown in FIG. 16.

First, in step S801, ZeroCoeff calculated by the additional information calculating unit 1201 is substituted into a variable TotalZeros.

Then, in step S802, the next image data in the block is input, and the flow advances to step S803.

In step S803, whether the value of the image data is zero is determined. If the value is zero, the flow advances to step S804 to subtract 1 from the value of TotalZeros, and further advances to step S805.

If the value is not zero in step S803, the flow advances to step S806 to output the present value of TotalZeros and terminate the processing.

In step S805, whether the present image data is the last data of the block is determined. If the image data is the last data of the block, the processing advances to step S806 to output the present value of TotalZeros as a calculation result, and terminate the processing for the present block. If the image data is not the last data of the block, the flow returns to step S802 to input the next image data.

By the method described above, the first syntax element generation unit 1202 can calculate the values of TotalCoeff, TrailingOnes, and TotalZeros when data having an absolute value of 2 or more or third data having an absolute value of 1 is read out.

The processing in the second syntax element calculating unit 1104 is the same as in the first embodiment, so an explanation thereof will be omitted. Note that the second syntax element calculating unit 1104 can calculate Run and Level when nonzero data is read out.

In the second embodiment of the present invention as described above, the second coding unit 1106 selects a variable-length coding table in advance by using the syntax elements calculated by the first syntax element calculating unit 1103, and performs variable-length coding of Run and Level. Variable-length coding cannot be started unless the values of TotalCoeff, TrailingOnes, and TotalZeros are determined.

However, if it takes a long time to read out data having an absolute value of 2 or more or third data having an absolute value of 1, the numbers of Run and Level are small. Therefore, variable-length coding can be completed in the same clock cycle as when the last data in the block is read out as a whole.

In parallel with this processing, the first coding unit 1105 performs variable-length coding on TotalCoeff, TrailingOnes, and TotalZeros. As a consequence, variable-length codes of all syntax elements can be obtained in the same clock cycle as when read of image data in the block from the storage unit 1102 is completed.

Also, if the values of first syntax elements can be calculated more easily from image data read out in the reverse zigzag scan order, the circuit scale of the first syntax element calculating unit 1103 can be made smaller than that in the first embodiment.

Note that in the first and second embodiments of the present invention, the number of image data input in each cycle is 1. However, the present invention is also applicable to a method in which a plurality of image data are input in each cycle by performing coding processes in parallel.

Note also that in the first and second embodiments of the present invention, the CAVLC method of H.264 is explained as an example. However, the present invention can also be applied to coding of a plurality of syntax elements depending one each other, in addition to the CAVLC method.

Other Embodiments

The invention can be implemented by supplying a software program, which implements the functions of the foregoing embodiments, directly or indirectly to a system or apparatus, reading the supplied program code with a computer of the system or apparatus, and then executing the program code. In this case, so long as the system or apparatus has the functions of the program, the mode of implementation need not rely upon a program.

Accordingly, since the functions of the present invention are implemented by computer, the program code installed in the computer also implements the present invention. In other words, the claims of the present invention also cover a computer program for the purpose of implementing the functions of the present invention.

In this case, so long as the system or apparatus has the functions of the program, the program may be executed in any form, such as an object code, a program executed by an interpreter, or scrip data supplied to an operating system.

Example of storage media that can be used for supplying the program are a floppy disk, a hard disk, an optical disk, a magneto-optical disk, a CD-ROM, a CD-R, a CD-RW, a magnetic tape, a non-volatile type memory card, a ROM, and a DVD (DVD-ROM and a DVD-R).

As for the method of supplying the program, a client computer can be connected to a website on the Internet using a browser of the client computer, and the computer program of the present invention or an automatically-installable compressed file of the program can be downloaded to a recording medium such as a hard disk. Further, the program of the present invention can be supplied by dividing the program code constituting the program into a plurality of files and downloading the files from different websites. In other words, a WWW (World Wide Web) server that downloads, to multiple users, the program files that implement the functions of the present invention by computer is also covered by the claims of the present invention.

It is also possible to encrypt and store the program of the present invention on a storage medium such as a CD-ROM, distribute the storage medium to users, allow users who meet certain requirements to download decryption key information from a website via the Internet, and allow these users to decrypt the encrypted program by using the key information, whereby the program is installed in the user computer.

Besides the cases where the aforementioned functions according to the embodiments are implemented by executing the read program by computer, an operating system or the like running on the computer may perform all or a part of the actual processing so that the functions of the foregoing embodiments can be implemented by this processing.

Furthermore, after the program read from the storage medium is written to a function expansion board inserted into the computer or to a memory provided in a function expansion unit connected to the computer, a CPU or the like mounted on the function expansion board or function expansion unit performs all or a part of the actual processing so that the functions of the foregoing embodiments can be implemented by this processing.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application No. 2004-331107 filed on Nov. 15, 2004, which is hereby incorporated herein by reference herein.

What is claimed is:

1. A variable-length coding apparatus which receives *a block of* image data [block by block, and generates coded data from syntax elements], comprising:

a storage unit that [temporarily] stores the *block of* image data;

a first syntax element calculating unit that calculates a first syntax element from the *block of* image data, at the same time the *block of* image data is stored in [said] *the* storage unit;

a first coding unit that generates coded data of the first syntax element [from a value of] *based on* the first syntax element;

a second syntax element calculating unit that reads out the *block of* image data [stored in said] *from the* storage unit, and calculates [a value of] a second syntax element from the *block of* image data *which is read out from the storage unit*;

a second coding unit that generates coded data of the second syntax element *based* on [the basis of the values of] the first *syntax element* and *the* second syntax [elements] *element*; and a packing unit that packs the coded data of the first *syntax element* and *the coded data of the* second syntax [elements] *element*.

2. The apparatus according to claim 1, wherein [said] *the* second syntax element calculating unit reads out the *block of* image data stored in [said] *the* storage unit in a reverse zigzag scan order[, and calculates] *to calculate* the second syntax element.

3. The apparatus according to claim 1, wherein the first syntax element includes at least one of the number of nonzero data in [a] *the* block *of image data*, the number of zero data in the block *of image data*, the number of zero data input before last nonzero data in the block *of image data*, and the number of data having an absolute value of 1 and input after last data having an absolute value of not less than 2 in the block *of image data*.

4. The apparatus according to claim 1, wherein the second syntax element includes at least one of a zero run length [of] *corresponding to* the *block of* image data and a level value [of] *corresponding to* the *block of* image data.

5. The apparatus according to claim 1, wherein [said] *the* first syntax element calculating unit comprises:

an additional information calculating unit that calculates additional information [indicating] *based on the block of image data, the additional information including* at least one of the number of zero data and the number of nonzero data [from the input image data]; and a first syntax element [generation] *generating* unit that calculates the first syntax element *based* on [the basis of] *the additional information and* the *block of* image data [temporarily stored in said] *which is read out from the* storage unit [and the additional information calculated by said additional information calculating unit].

6. The apparatus according to claim 5, wherein the *block of* image data [from said storage unit] is read out *from the storage unit* in a reverse zigzag scan order, and *is* supplied to [said] *the* first syntax element [generation] *generating* unit.

7. A variable-length coding method [which receives image data block by block, and generates coded data from syntax elements], comprising:

*receiving a block of image data;*

[temporarily] storing the *block of* image data in a storage unit;

calculating a first syntax element from the *block of* image data, at the same time the *block of* image data is stored in the storage unit;

generating coded data of the first syntax element [from a value of] *based on* the first syntax element;

reading out the *block of* image data [stored in] *from* the storage unit, and calculating [a value of] a second syntax element from the *block of* image data *which is read out from the storage unit*;

generating coded data of the second syntax element *based* on [the basis of the values of] the first *syntax element* and *the* second syntax [elements] *element*; and connecting the coded data of the first *syntax element* and *the coded data of the* second syntax [elements] *element*.

8. The method according to claim 7, wherein [said second syntax element calculation,] the *block of* image data stored in the storage unit is read out in a reverse zigzag scan order[, and] *to calculate* the second syntax element [is calculated].

9. The method according to claim 7, wherein the first syntax element includes [a] *at* least one of the number of nonzero data in [a] *the* block *of image data*, the number of zero data in the block *of image data*, the number of zero data input before last nonzero data in the block *of image data*, and the number of data having an absolute value of 1 and input after last data having an absolute value of not less than 2 in the block *of image data*.

10. The method according to claim 7, wherein the second syntax element includes at least [on] *one* of a zero run length [of] *corresponding to* the *block of* image data and a level value [of] *corresponding to* the *block of* image data.

11. The method according to claim 7, [wherein in said first syntax element calculation,] *further comprising:*

*calculating* additional information [indicating] *based on the block of image data, the additional information including* at least one of the number of zero data and the number of nonzero data, [from the input image data are calculated; and]

*wherein* the first syntax element is calculated *based* on [the basis of] *the additional information and* the *block of* image data [temporarily stored in] *which is read out from* the storage unit [and the additional information calculated in said additional information calculation].

12. The method according to claim 11, wherein the *block of* image data [from the storage unit] is read out *from the storage unit* in a reverse zigzag scan order[, and used in said] *to calculate the* first syntax element [synthesizing].

13. A non-transitory computer-readable storage medium [having stored thereon] *that stores* a program [which is executable by an image processing apparatus, the program having a program code for performing the variable-length coding method cited in claim 7] *for causing a computer to execute a variable-length coding method, the variable-length coding method comprising:*

*receiving a block of image data;*

*storing the block of image data in a storage unit;*

*calculating a first syntax element from the block of image data, at the same time the block of image data is stored in the storage unit;*

*generating coded data of the first syntax element based on the first syntax element;*

*reading out the block of image data from the storage unit, and calculating a second syntax element from the block of image data which is read out from the storage unit;*

*generating coded data of the second syntax element based on the first syntax element and the second syntax element; and*

*connecting the coded data of the first syntax element and the coded data of the second syntax element.*

*14. A coding apparatus which receives a block of image data, comprising:*

*a storage unit that stores the block of image data;*

*a first syntax element calculating unit that calculates a first syntax element from the block of image data, in parallel with the block of image data being stored in the storage unit;*

*a first coding unit that generates coded data of the first syntax element based on the first syntax element;*

*a second syntax element calculating unit that calculates a second syntax element from the block of image data which is read out from the storage unit; and*

*a second coding unit that generates coded data of the second syntax element based on the first syntax element and the second syntax element.*

*15. The apparatus according to claim 14, wherein the second coding unit selects a variable-length coding table in accordance with the first syntax element.*

*16. The apparatus according to claim 15, wherein the second coding unit codes the second syntax element in accordance with the selected variable-length coding table.*

*17. The apparatus according to claim 14, wherein the block of image data is read out from the storage unit in a reverse zigzag scan order, and is supplied to the second syntax element calculating unit.*

*18. The apparatus according to claim 14, wherein the first syntax element includes at least one of the number of nonzero data in the block of image data, the number of zero data in the block of image data, the number of zero data input before last nonzero data in the block of image data, and the number of data having an absolute value of 1 and input after last data having an absolute value of not less than 2 in the block of image data.*

*19. The apparatus according to claim 14, wherein the second syntax element includes at least one of a zero run*

*length corresponding to the block of image data and a level value corresponding to the block of image data.*

*20. The apparatus according to claim 14, wherein the first syntax element calculating unit calculates additional information based on the block of image data, the additional information including at least one of the number of zero data and the number of nonzero data, and*

*wherein the first syntax element calculating unit calculates the first syntax element based on the additional information and the block of image data which is read out from the storage unit.*

*21. The apparatus according to claim 20, wherein the block of image data is read out from the storage unit in a reverse zigzag scan order, and is supplied to the first syntax element calculating unit.*

*22. The apparatus according to claims 14, further comprising*

*a packing unit that packs the coded data of the first syntax element and the coded data of the second syntax element.*

*23. A coding apparatus which receives a block of image data, comprising:*

*a storage unit that stores the block of image data;*

*a first syntax element calculating unit that calculates a first syntax element from the block of image data, in parallel with the block of image data being stored in the storage unit;*

*a first coding unit that codes the first syntax element to generate coded data of the first syntax element;*

*a second syntax element calculating unit that calculates a second syntax element from the block of image data which is read out from the storage unit; and*

*a second coding unit that codes the second syntax element based on the first syntax element to generate coded data of the second syntax element.*

*24. The apparatus according to claim 23, wherein a process of calculating the second syntax element is performed in parallel with a process of storing another block of image data in the storage unit.*

*25. The apparatus according to claim 23, wherein a process of coding the second syntax element is performed in parallel with a process of storing another block of image data in the storage unit.*

*26. The apparatus according to claim 23, wherein a process of coding the first syntax element is performed in parallel with a process of calculating first syntax element from another block of image data.*

*27. The apparatus according to claim 23, further comprising*

*a packing unit that packs the coded data of the first syntax element and the coded data of the second syntax element.*

*28. The apparatus according to claim 23, wherein a data line for the block of image data is connected to the storage unit and the first syntax element calculating unit,*

*the first syntax element calculating unit and the second syntax element calculating unit are connected to the second coding unit, and*

*the first syntax element calculating unit is connected to the first coding unit.*

*29. A method comprising:*

*receiving a block of image data;*

*storing the block of image data in a storage unit;*

*calculating a first syntax element from the block of image data, in parallel with the block of image data being stored in the storage unit;*

*generating coded data of the first syntax element based on the first syntax element;*

*calculating a second syntax element from the block of image data which is read out from the storage unit; and*

*generating coded data of the second syntax element based on the first syntax element and the second syntax element.*

*30. The method according to claim 29, wherein when a process of calculating the second syntax element is performed, a variable-length coding table is selected in accordance with the first syntax element.*

*31. The method according to claim 30, wherein the second syntax element is coded in accordance with the selected variable-length coding table.*

*32. The method according to claim 29, wherein the block data stored in the storage unit is read out in a reverse zigzag scan order.*

*33. The method according to claim 29, wherein the first syntax element includes at least one of the number of nonzero data in the block of image data, the number of zero data in the block of image data, the number of zero data input before last nonzero data in the block of image data, and the number of data having an absolute value of 1 and input after last data having an absolute value of not less than 2 in the block of image data.*

*34. The method according to claim 29, wherein the second syntax element includes at least one of a zero run length corresponding to the block of image data and a level value corresponding to the block of image data.*

*35. The method according to claim 29, further comprising*

*calculating additional information based on the block of image data, the additional information including at least one of the number of zero data and the number of nonzero data; and*

*calculating the first syntax element based on the additional information and the block of image data which is read out from the storage unit.*

*36. The method according to claim 35, wherein the block of image data is read out from the storage unit in a reverse zigzag scan order, and is supplied to a first syntax element calculating unit that calculates the first syntax element from the block of image data.*

*37. A method comprising:*

*receiving a block of image data;*

*storing the block of image data in a storage unit;*

*calculating a first syntax element from the block of image data, in parallel with the block of image data being stored in the storage unit;*

*coding the first syntax element to generate coded data of the first syntax element;*

*calculating a second syntax element from the block of image data which is read out from the storage unit; and*

*coding the second syntax element based on the first syntax element to generate coded data of the second syntax element.*

*38. The method according to claim 37, wherein a process of calculating the second syntax element is performed in parallel with a process of storing another block of image data in the storage unit.*

*39. The method according to claim 37, wherein a process of coding the second syntax element is performed in parallel with a process of storing another block of image data in the storage unit.*

*40. The method according to claim 37, wherein a process of coding the first syntax element is performed in parallel with a process of calculating first syntax element from another block of image data.*

*41. The method according to claim 37, further comprising*

*packing the coded data of the first syntax element and the coded data of the second syntax element.*

*42. A non-transitory computer-readable storage medium that stores a program for causing a computer to execute a method, the method comprising:*

*receiving a block of image data;*

*storing the block of image data in a storage unit;*

*calculating a first syntax element from the block of image data, in parallel with the block of image data being stored in the storage unit;*

*generating coded data of the first syntax element based on the first syntax element;*

*calculating a second syntax element from the block of image data which is read out from the storage unit; and*

*generating coded data of the second syntax element based on the first syntax element and the second syntax element.*

*43. A non-transitory computer-readable storage medium that stores a program for causing a computer to execute a method, the method comprising:*

*receiving a block of image data;*

*storing the block of image data in a storage unit;*

*calculating a first syntax element from the block of image data, in parallel with the block of image data being stored in the storage unit;*

*coding the first syntax element to generate coded data of the first syntax element;*

*calculating a second syntax element from the block of image data which is read out from the storage unit; and*

*coding the second syntax element based on the first syntax element to generate coded data of the second syntax element.*

*44. A coding apparatus comprising:*

*a storage unit that stores a block of image data;*

*a first syntax element calculating unit that calculates a first syntax element of the block of image data;*

*a first coding unit that generates coded data of the first syntax element based on the first syntax element;*

*a second syntax element calculating unit that calculates a second syntax element of the block of image data based on the block of image data which is read out from the storage unit; and*

*a second coding unit that generates coded data of the second syntax element based on the first syntax element and the second syntax element,*

*wherein in a case where the block of image data is encoded,*

*the first syntax element calculating unit calculates the first syntax element of the block of image data in parallel with storing the block of image data in the storage unit, and*

*the second syntax element calculating unit calculates the second syntax element of the block of image data based on the block of image data which is read out from the storage unit.*

*45. The apparatus according to claim 44, wherein the block of image data is read out from the storage unit in a reverse zigzag scan order, and is supplied to the second syntax element calculating unit.*

*46. The apparatus according to claim 44, wherein the first syntax element includes at least one of the number of nonzero data in the block of image data, the number of zero data in the block of image data, the number of zero data input before last nonzero data in the block of image data, and the number of data having an absolute value of 1 and input after last data having an absolute value of not less than 2 in the block of image data.*

*47. The apparatus according to claim 44, wherein the second syntax element includes at least one of a zero run length corresponding to the block of image data and a level value corresponding to the block of image data.*

*48. The apparatus according to claim 44, wherein the first syntax element calculating unit calculates additional information based on the block of image data, the additional information including at least one of the number of zero data and the number of nonzero data, and*

*wherein the first syntax element calculating unit calculates the first syntax element based on the additional information and the block of image data which is read out from the storage unit.*

*49. The apparatus according to claim 48, wherein the block of image data is read out from the storage unit in a reverse zigzag scan order, and is supplied to the first syntax element calculating unit.*

*50. The apparatus according to claims 44, further comprising*

*a packing unit that packs the coded data of the first syntax element and the coded data of the second syntax element.*

*51. A method comprising:*

*storing a block of image data in a storage unit;*

*calculating a first syntax element of the block of image data;*

*generating coded data of the first syntax element based on the first syntax element;*

*calculating a second syntax element of the block of image data based on the block of image data which is read out from the storage unit; and*

*generating coded data of the second syntax element based on the first syntax element and the second syntax element,*

*wherein in a case where the block of image data is encoded,*

*the first syntax element of the block of image data is calculated in parallel with storing the block of image data in the storage unit, and*

*the second syntax element of the block of image data is calculated based on the block of image data which is read out from the storage unit.*

*52. A non-transitory computer-readable storage medium that stores a program for causing a computer to execute a method, the method comprising:*

*storing a block of image data in a storage unit;*

*calculating a first syntax element of the block of image data;*

*generating coded data of the first syntax element based on the first syntax element;*

*calculating a second syntax element of the block of image data based on the block of image data which is read out from the storage unit; and*

*generating coded data of the second syntax element based on the first syntax element and the second syntax element,*

*wherein in a case where the block of image data is encoded,*

*the first syntax element of the block of image data is calculated in parallel with storing the block of image data in the storage unit, and*

*the second syntax element of the block of image data is calculated based on the block of image data which is read out from the storage unit.*

*53. A coding apparatus comprising:*

*a storage unit that stores a block of image data;*

*a first syntax element calculating unit that calculates a first syntax element of the block of image data;*

*a first coding unit that generates coded data of the first syntax element based on the first syntax element;*

*a second syntax element calculating unit that calculates a second syntax element of the block of image data based on the block of image data which is read out from the storage unit; and*

*a second coding unit that generates coded data of the second syntax element based on the first syntax element and the second syntax element,*

*wherein in a case where the block of image data is encoded,*

*the first syntax element calculating unit calculates the first syntax element of the block of image data when the block of image data is stored in the storage unit, and*

*the second syntax element calculating unit calculates the second syntax element of the block of image data based on the block of image data which is read out from the storage unit.*

*54. The apparatus according to claim 53, wherein the block of image data is read out from the storage unit in a reverse zigzag scan order, and is supplied to the second syntax element calculating unit.*

*55. The apparatus according to claim 53, wherein the first syntax element includes at least one of the number of nonzero data in the block of image data, the number of zero data in the block of image data, the number of zero data input before last nonzero data in the block of image data, and the number of data having an absolute value of 1 and input after last data having an absolute value of not less than 2 in the block of image data.*

*56. The apparatus according to claim 53, wherein the second syntax element includes at least one of a zero run length corresponding to the block of image data and a level value corresponding to the block of image data.*

*57. The apparatus according to claim 53, wherein the first syntax element calculating unit calculates additional information based on the block of image data, the additional information including at least one of the number of zero data and the number of nonzero data, and*

*wherein the first syntax element calculating unit calculates the first syntax element based on the additional information and the block of image data which is read out from the storage unit.*

*58. The apparatus according to claim 57, wherein the block of image data is read out from the storage unit in a reverse zigzag scan order, and is supplied to the first syntax element calculating unit.*

*59. The apparatus according to claims 53, further comprising*

*a packing unit that packs the coded data of the first syntax element and the coded data of the second syntax element.*

*60. A method comprising:*

*storing a block of image data in a storage unit;*

*calculating a first syntax element of the block of image data;*

*generating coded data of the first syntax element based on the first syntax element;*

*calculating a second syntax element of the block of image data based on the block of image data which is read out from the storage unit; and*

*generating coded data of the second syntax element based on the first syntax element and the second syntax element,*

*wherein in a case where the block of image data is encoded,*

*the first syntax element of the block of image data is calculated when the block of image data is stored in the storage unit, and*

*the second syntax element of the block of image data is calculated based on the block of image data which is read out from the storage unit.*

*61. A non-transitory computer-readable storage medium that stores a program for causing a computer to execute a method, the method comprising:*

*storing a block of image data in a storage unit;*

*calculating a first syntax element of the block of image data;*

*generating coded data of the first syntax element based on the first syntax element;*

*calculating a second syntax element of the block of image data based on the block of image data which is read out from the storage unit; and*

*generating coded data of the second syntax element based on the first syntax element and the second syntax element,*

*wherein in a case where the block of image data is encoded,*

*the first syntax element of the block of image data is calculated when the block of image data is stored in the storage unit, and*

*the second syntax element of the block of image data is calculated based on the block of image data which is read out from the storage unit.*

*62. A coding apparatus comprising:*

*a storage unit that stores a block of image data;*

*a first syntax element calculating unit that calculates a first syntax element of the block of image data;*

*a first coding unit that generates coded data of the first syntax element based on the first syntax element;*

*a second syntax element calculating unit that calculates a second syntax element of the block of image data based on the block of image data which is read out from the storage unit; and*

*a second coding unit that generates coded data of the second syntax element based on the first syntax element and the second syntax element,*

*wherein in a case where the block of image data is encoded,*

*the first syntax element calculating unit calculates the first syntax element of the block of image data before storing the block of image data in the storage unit is finished, and*

*the second syntax element calculating unit calculates the second syntax element of the block of image data based on the block of image data which is read out from the storage unit after storing the block of image data in the storage unit is finished.*

*63. The apparatus according to claim 62, wherein the block of image data is read out from the storage unit in a reverse zigzag scan order, and is supplied to the second syntax element calculating unit.*

*64. The apparatus according to claim 62, wherein the first syntax element includes at least one of the number of nonzero data in the block of image data, the number of zero data in the block of image data, the number of zero data input before last nonzero data in the block of image data, and the number of data having an absolute value of 1 and input after last data having an absolute value of not less than 2 in the block of image data.*

*65. The apparatus according to claim 62, wherein the second syntax element includes at least one of a zero run length corresponding to the block of image data and a level value corresponding to the block of image data.*

*66. The apparatus according to claim 62, wherein the first syntax element calculating unit calculates additional information based on the block of image data, the additional*

*information including at least one of the number of zero data and the number of nonzero data, and*

*wherein the first syntax element calculating unit calculates the first syntax element based on the additional information and the block of image data which is read out from the storage unit.*

*67. The apparatus according to claim 66, wherein the block of image data is read out from the storage unit in a reverse zigzag scan order, and is supplied to the first syntax element calculating unit.*

*68. The apparatus according to claims 62, further comprising*

*a packing unit that packs the coded data of the first syntax element and the coded data of the second syntax element.*

*69. A method comprising:*

*storing a block of image data in a storage unit;*

*calculating a first syntax element of the block of image data;*

*generating coded data of the first syntax element based on the first syntax element;*

*calculating a second syntax element of the block of image data based on the block of image data which is read out from the storage unit; and*

*generating coded data of the second syntax element based on the first syntax element and the second syntax element,*

*wherein in a case where the block of image data is encoded,*

*the first syntax element of the block of image data is calculated before storing the block of image data in the storage unit is finished, and*

*the second syntax element of the block of image data is calculated based on the block of image data which is read out from the storage unit after storing the block of image data in the storage unit is finished.*

*70. A non-transitory computer-readable storage medium that stores a program for causing a computer to execute a method, the method comprising:*

*storing a block of image data in a storage unit;*

*calculating a first syntax element of the block of image data;*

*generating coded data of the first syntax element based on the first syntax element;*

*calculating a second syntax element of the block of image data based on the block of image data which is read out from the storage unit; and*

*generating coded data of the second syntax element based on the first syntax element and the second syntax element,*

*wherein in a case where the block of image data is encoded,*

*the first syntax element of the block of image data is calculated before storing the block of image data in the storage unit is finished, and*

*the second syntax element of the block of image data is calculated based on the block of image data which is read out from the storage unit after storing the block of image data in the storage unit is finished.*

*71. A coding apparatus comprising:*

*a storage unit that stores a block of image data;*

*a first syntax element calculating unit that calculates a first syntax element of the block of image data;*

*a first coding unit that generates coded data of the first syntax element based on the first syntax element;*

*a second syntax element calculating unit that calculates a second syntax element of the block of image data based on the block of image data which is read out from the storage unit; and*

*a second coding unit that generates coded data of the second syntax element based on the first syntax element and the second syntax element,*

*wherein an order that the first syntax element calculating unit processes the block of image data and an order that the second syntax element calculating unit processes the block of image data are different from each other.*

*72. The apparatus according to claim 71, wherein the block of image data is read out from the storage unit in a reverse zigzag scan order, and is supplied to the second syntax element calculating unit.*

*73. The apparatus according to claim 71, wherein the first syntax element includes at least one of the number of nonzero data in the block of image data, the number of zero data in the block of image data, the number of zero data input before last nonzero data in the block of image data, and the number of data having an absolute value of 1 and input after last data having an absolute value of not less than 2 in the block of image data.*

*74. The apparatus according to claim 71, wherein the second syntax element includes at least one of a zero run length corresponding to the block of image data and a level value corresponding to the block of image data.*

*75. The apparatus according to claim 71, wherein the first syntax element calculating unit calculates additional information based on the block of image data, the additional information including at least one of the number of zero data and the number of nonzero data, and*

*wherein the first syntax element calculating unit calculates the first syntax element based on the additional information and the block of image data which is read out from the storage unit.*

*76. The apparatus according to claim 75, wherein the block of image data is read out from the storage unit in a reverse zigzag scan order, and is supplied to the second syntax element calculating unit.*

*77. The apparatus according to claims 71, further comprising*

*a packing unit that packs the coded data of the first syntax element and the coded data of the second syntax element.*

*78. A method comprising:*

*storing a block of image data in a storage unit;*

*calculating a first syntax element of the block of image data;*

*generating coded data of the first syntax element based on the first syntax element;*

*calculating a second syntax element of the block of image data based on the block of image data which is read out from the storage unit; and*

*generating coded data of the second syntax element based on the first syntax element and the second syntax element,*

*wherein an order that the block of image data is processed to calculate the first syntax element and an order that the block of image data is processed to calculate the second syntax element are different from each other.*

*79. A non-transitory computer-readable storage medium that stores a program for causing a computer to execute a method, the method comprising:*

*storing a block of image data in a storage unit;*

*calculating a first syntax element of the block of image data;*

*generating coded data of the first syntax element based on the first syntax element;*

*calculating a second syntax element of the block of image data based on the block of image data which is read out from the storage unit; and*

*generating coded data of the second syntax element based on the first syntax element and the second syntax element,*

*wherein an order that the block of image data is processed to calculate the first syntax element and an order that the block of image data is processed to calculate the second syntax element are different from each other.*

*80. A coding apparatus comprising:*

*a storage unit that stores a block of image data;*

*a first syntax element calculating unit that calculates a first syntax element of the block of image data;*

*a first coding unit that generates coded data of the first syntax element based on the first syntax element;*

*a second syntax element calculating unit that calculates a second syntax element of the block of image data based on the block of image data which is read out from the storage unit; and*

*a second coding unit that generates coded data of the second syntax element based on the first syntax element and the second syntax element,*

*wherein the block of image data is stored in the storage unit in parallel with being processed by the first syntax element calculating unit.*

*81. The apparatus according to claim 80, wherein the block of image data is read out from the storage unit in a reverse zigzag scan order, and is supplied to the second syntax element calculating unit.*

*82. The apparatus according to claim 80, wherein the first syntax element includes at least one of the number of nonzero data in the block of image data, the number of zero data in the block of image data, the number of zero data input before last nonzero data in the block of image data, and the number of data having an absolute value of 1 and input after last data having an absolute value of not less than 2 in the block of image data.*

*83. The apparatus according to claim 80, wherein the second syntax element includes at least one of a zero run length corresponding to the block of image data and a level value corresponding to the block of image data.*

*84. The apparatus according to claim 80, wherein the first syntax element calculating unit calculates additional information based on the block of image data, the additional information including at least one of the number of zero data and the number of nonzero data, and*

*wherein the first syntax element calculating unit calculates the first syntax element based on the additional information and the block of image data which is read out from the storage unit.*

*85. The apparatus according to claim 84, wherein the block of image data is read out from the storage unit in a reverse zigzag scan order, and is supplied to the first syntax element calculating unit.*

*86. The apparatus according to claims 80, further comprising*

*a packing unit that packs the coded data of the first syntax element and the coded data of the second syntax element.*

*87. A method comprising:*

*storing a block of image data in a storage unit;*

*calculating a first syntax element of the block of image data;*

*generating coded data of the first syntax element based on the first syntax element;*

*calculating a second syntax element of the block of image data based on the block of image data which is read out from the storage unit; and*

*generating coded data of the second syntax element based on the first syntax element and the second syntax element,*

*wherein the block of image data is stored in the storage unit in parallel with being processed to calculate the first syntax element.*

*88. A non-transitory computer-readable storage medium that stores a program for causing a computer to execute a method, the method comprising:*

*storing a block of image data in a storage unit;*

*calculating a first syntax element of the block of image data;*

*generating coded data of the first syntax element based on the first syntax element;*

*calculating a second syntax element of the block of image data based on the block of image data which is read out from the storage unit; and*

*generating coded data of the second syntax element based on the first syntax element and the second syntax element,*

*wherein the block of image data is stored in the storage unit in parallel with being processed to calculate the first syntax element.*

* * * * *